US009385183B2

(12) United States Patent
Chen et al.

(10) Patent No.: US 9,385,183 B2
(45) Date of Patent: Jul. 5, 2016

(54) SEMICONDUCTOR DEVICE

(71) Applicants:Ze Chen, Tokyo (JP); Tsuyoshi Kawakami, Tokyo (JP); Katsumi Nakamura, Tokyo (JP)

(72) Inventors: Ze Chen, Tokyo (JP); Tsuyoshi Kawakami, Tokyo (JP); Katsumi Nakamura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/434,388

(22) PCT Filed: Dec. 6, 2012

(86) PCT No.: PCT/JP2012/081661
§ 371 (c)(1),
(2) Date: Apr. 8, 2015

(87) PCT Pub. No.: WO2014/087522
PCT Pub. Date: Jun. 12, 2014

(65) Prior Publication Data
US 2015/0279931 A1    Oct. 1, 2015

(51) Int. Cl.
*H01L 27/01*  (2006.01)
*H01L 27/12*  (2006.01)
(Continued)

(52) U.S. Cl.
CPC ........ *H01L 29/0619* (2013.01); *H01L 29/0638* (2013.01); *H01L 29/4236* (2013.01); *H01L 29/7395* (2013.01); *H01L 29/7397* (2013.01)

(58) Field of Classification Search
CPC .............. H01L 21/8238; H01L 21/048; H01L 21/02576; H01L 21/02579; H01L 21/3242; H01L 27/1104; H01L 27/3248; H01L 29/435; H01L 29/0922; H01L 29/7816; H01L 29/66325; H01L 29/66318; H01L 29/7393; H01L 51/102; H01L 51/0508

USPC ........ 257/127, 152, 170, 153, 260, 262, 272, 257/279, 322, 341, 350, 401, 544, E21.066, 257/E21.045, E21.37, E21.38, E21.381, 257/E21.382, E21.421
See application file for complete search history.

(56) References Cited

U.S. PATENT DOCUMENTS

| 4,573,066 A | 2/1986 | Whight |
| 4,672,738 A | 6/1987 | Stengl et al. |

(Continued)

FOREIGN PATENT DOCUMENTS

| JP | S59-110164 A | 6/1984 |
| JP | S61-84830 A | 4/1986 |

(Continued)

OTHER PUBLICATIONS

Notification of Transmittal of Translation of the International Preliminary Report on Patentability and Translation of Written Opinion of the International Searching Authority; PCT/JP2012/081661 issued on Jun. 18, 2015.

(Continued)

*Primary Examiner* — David Nhu
(74) *Attorney, Agent, or Firm* — Studebaker & Brackett PC

(57) ABSTRACT

The termination region includes a ring region (LNFLR). A plurality of ring-shaped P-type ring layers are regularly arranged in the ring region (LNFLR). The ring region (LNFLR) is divided into a plurality of units which include the plurality of P-type ring layers respectively. A width of each unit is constant. A total number of P-type impurities in the ring region (LNFLR) is N, the target withstand voltage is BV [V], a width of each unit is SandL [μm], and the number of the plurality of units is num, following relationships are satisfied. $N \geq (M \times BV)^\gamma$, $M=10^4$ to $10^5$, $\gamma=0.55$ to $1.95$, $SandL \times num \times Ecri \geq 2 \times \alpha \times BV$, $Ecri=2.0$ to $3.0 \times 10^5$ [V/cm], $\alpha=10^0$ to $10^1$. Widths of the P-type ring layers of the plurality of units linearly decrease toward an outside of the termination region.

8 Claims, 31 Drawing Sheets

(51) Int. Cl.
*H01L 31/0392* (2006.01)
*H01L 29/06* (2006.01)
*H01L 29/739* (2006.01)
*H01L 29/423* (2006.01)

(56) References Cited

U.S. PATENT DOCUMENTS

| | | | | |
|---|---|---|---|---|
| 6,870,201 B1 * | 3/2005 | Deboy | ............... | H01L 29/0634 257/170 |
| 8,563,988 B2 * | 10/2013 | Uchida | ............... | H01L 29/7828 257/77 |
| 8,866,215 B2 * | 10/2014 | Pfirsch | ............... | H01L 29/7825 257/329 |
| 8,969,929 B2 * | 3/2015 | Sakanishi | ......... | H01L 29/66681 257/287 |
| 9,006,748 B2 * | 4/2015 | Tanaka | ............... | H01L 29/6606 257/77 |
| 2006/0043480 A1 | 3/2006 | Tsuchitani et al. | | |

FOREIGN PATENT DOCUMENTS

| | | | |
|---|---|---|---|
| JP | 2001-522145 | A | 11/2001 |
| JP | 2002-231965 | A | 8/2002 |
| JP | 2003-078138 | A | 3/2003 |
| JP | 2006-073740 | A | 3/2006 |
| JP | 2008-010506 | A | 1/2008 |
| JP | 2012-104577 | A | 5/2012 |
| JP | 2012-156151 | A | 8/2012 |

OTHER PUBLICATIONS

An Office Action; "Notice of Reasons for Rejection," issued by the Japanese Patent Office on Jan. 5, 2016, which corresponds to Japanese Patent Application No. 2014-550864 and is related to U.S. Appl. No. 14/434,388; with English language partial translation.
International Search Report; PCT/JP2012/081661; Feb. 26, 2013.

* cited by examiner $V_{CC}$=4500V
TEMPERATURE=398K
$V_{GE}$ =0V $V_{CC}$=2800V
TEMPERATURE=398K
$V_G$=±15V
$L_S$=2.47μH

SEMICONDUCTOR DEVICE

This application is a National Phase application under 35 U.S.C. §371 based on International Patent Application No. PCT/JP2012/081661 filed Dec. 6, 2012.

TECHNICAL FIELD

The present invention relates to a semiconductor device for forming a high-voltage power module withstanding 600 V or higher.

BACKGROUND ART

In power semiconductor devices, a termination region is located around an active region in which a transistor is formed. There is a proposal for providing a plurality of P-type ring layers spaced apart from each other and one or a plurality of P-type layers connected together in a termination region to improve a withstand voltage (e.g., see Patent Literature 1).

CITATION LIST

Patent Literature

Patent Literature 1: National Publication of International Patent Application No. 2001-522145

SUMMARY OF INVENTION

Technical Problem

However, to increase a withstand voltage, it is necessary to increase the number of P-type ring layers, which causes the chip area to increase. Moreover, a high electric field is generated in a high-curvature part of an outermost P-type ring layer, which limits an upper limit of the withstand voltage and causes turn-off breaking capability to deteriorate.

When a P-type layer is provided in the termination region, since an allowable range of dose of the P-type layer is narrow, process control is difficult, resulting in a high defect ratio. When the dose of the P-type layer is outside the allowable range, a high electric field is generated on the active region side of the P-type layer or at an outside end, limiting an upper limit of the withstand voltage. Furthermore, forming a plurality of P-type layers requires a plurality of photolithography processes and an ion implantation step, making the manufacturing process more complicated and increasing the production cost.

An object of the present invention, which has been made to solve the above-described problems, is to provide a semiconductor device having a reduced chip area without deteriorating electric characteristics, improved turn-off breaking capability, widened allowable range of P-type dose and capable of being manufactured by simple manufacturing processes.

Means for Solving the Problems

A semiconductor device according to the present invention maintains a withstand voltage which is equal to or higher than a target withstand voltage, a silicon substrate is provided with an active region in which a transistor is formed and a termination region located around the active region, the termination region includes a ring region, a plurality of ring-shaped P-type ring layers are regularly arranged in the ring region, the ring region is divided into a plurality of units which include the plurality of P-type ring layers respectively, a width of each unit is constant, a total number of P-type impurities in the ring region is N, the target withstand voltage is BV [V], a width of each unit is SandL [µm], and the number of the plurality of units is num, following relationships are satisfied, $N \geq (M \times BV)^\gamma$, $M = 10^4$ to $10^5$, $\gamma = 0.55$ to $1.95$, $SandL \times num \times Ecri \geq 2 \times \alpha \times BV$, $Ecri = 2.0$ to $3.0 \times 10^5$ [V/cm], $\alpha = 10^0$ to $10^1$, and widths of the P-type ring layers of the plurality of units linearly decrease toward an outside of the termination region.

Advantageous Effects of Invention

The present invention makes it possible to provide a semiconductor device having a reduced chip area without deteriorating electric characteristics, improved turn-off breaking capability, widened allowable range of P-type dose and capable of being manufactured by simple manufacturing processes.

DESCRIPTION OF EMBODIMENTS

Figure 1:
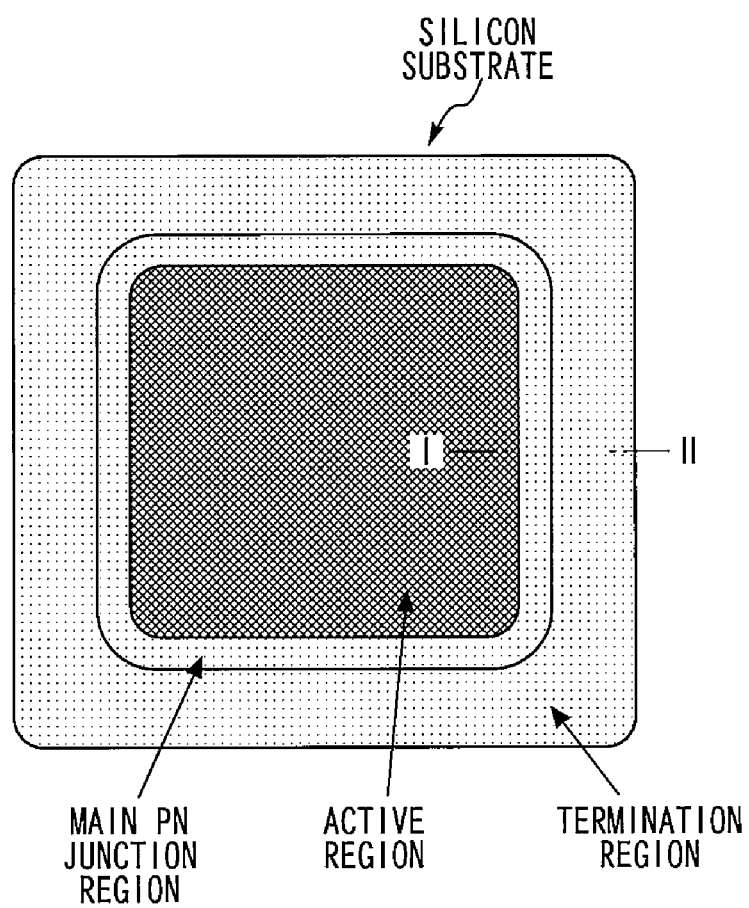
FIG. 1 is a plan view illustrating a semiconductor device according to Embodiment 1 of the present invention.

A semiconductor device according to embodiments of the present invention will be described with reference to the accompanying drawings. Like or corresponding components will be assigned like reference numerals and duplicate description may be omitted.

Embodiment 1

FIG. 1 is a plan view illustrating a semiconductor device according to Embodiment 1 of the present invention. A silicon substrate is provided with an active region in which a transistor is formed, a termination region located around the active region and a main PN junction region located between both regions. When a transistor is ON, a main current flows through the active region, but no main current flows through the termination region. When a bias is applied while the transistor is OFF, a depleted layer extends in a lateral direction of the device in the termination region and maintains a withstand voltage. In this way, the semiconductor device maintains a withstand voltage which is equal to or higher than a target withstand voltage.

Figure 2:
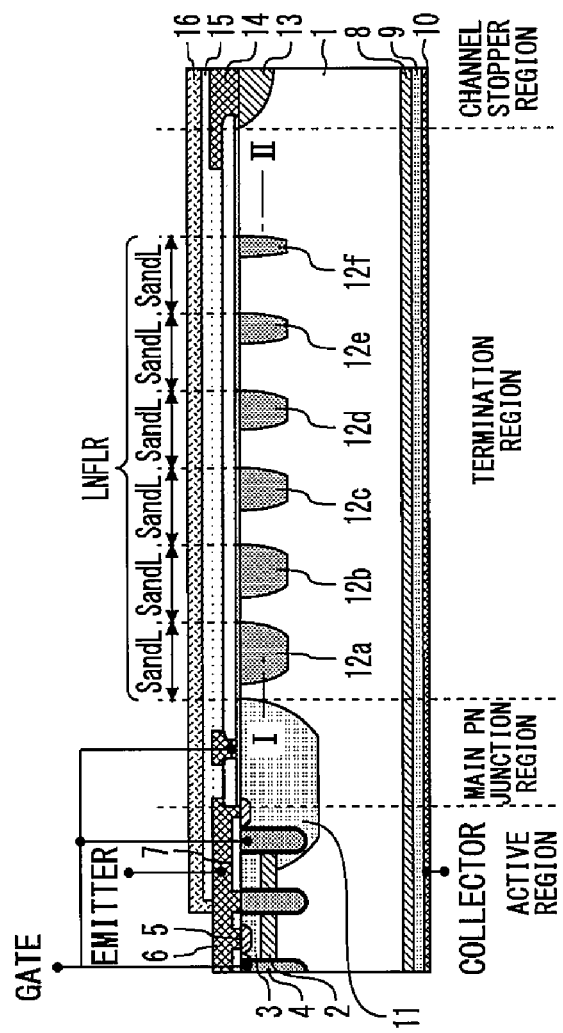
FIG. 2 is a cross-sectional view along I-II in FIG. 1.

FIG. 2 is a cross-sectional view along I-II in FIG. 1. An N-type layer 2 and a P-type emitter layer 3 are provided in that order on an N⁻-type drift layer 1 in the active region. A plurality of trench gates 4 are provided so as to penetrate the N-type layer 2 and the P-type emitter layer 3. A P⁺-type contact layer 5 is provided in part of the P-type emitter layer 3 between the plurality of trench gates 4. An emitter electrode 6 on the silicon substrate is connected to the P⁺-type contact layer 5. The emitter electrode 6 is insulated from the trench gate 4 via an inter-layer insulating film 7. An N-type layer 8 and a P-type collector layer 9 are provided in that order below the N⁻-type drift layer 1. A collector electrode 10 is connected to the P-type collector layer 9. These components make up an IGBT which is a transistor.

In the main PN junction region, a P-type layer 11 is provided on the N⁻-type drift layer 1. The termination region includes a ring region LNFLR (Linearly-Narrowed Field Limit Ring). In the ring region LNFLR, a plurality of ring-shaped P-type ring layers 12a to 12f are regularly arranged in line on the N⁻-type drift layer 1. A channel stopper region is provided on an outer circumferential side thereof. In the channel stopper region, an N-type layer 13 is provided on the N⁻-type drift layer 1. An electrode 14 is connected to the N-type layer 13. Top surface sides of the main PN junction region and the termination region are covered with insulating films 15 and 16.

A boundary between the main PN junction region and the active region is an end of the outermost P⁺-type contact layer 5 in the active region on the main PN junction region side. A boundary between the main PN junction region and the termination region is an end of the P-type layer 11 on the termination region side.

The ring region LNFLR is divided into a plurality of units which include the plurality of ring-shaped P-type ring layers respectively 12a to 12f and a width SandL of each unit is constant. The following conditions are satisfied assuming that the total number of ionized P-type impurities in the ring region LNFLR is N, a target withstand voltage is BV [V], a width of each unit is SandL [μm], and the number of the plurality of units is num.

$$N \geq (M \times BV)^{\gamma}, M=10^4 \text{ to } 10^5, \gamma=0.55 \text{ to } 1.95 \quad \text{(condition 1)}$$

$$SandL \times num \times Ecri \geq 2 \times \alpha \times BV, Ecri=2.0 \text{ to } 3.0 \times 10^5 \text{ [V/cm]}, \alpha=10^0 \text{ to } 10^1 \quad \text{(condition 2)}$$

The widths of the P-type ring layers 12a to 12f of the plurality of units linearly decrease toward the outside of the termination region (condition 3). The amount of change thereof β is 0<β≤1.5.

The condition 1 is a condition for the total number of P-type impurities N necessary to satisfy the target withstand voltage BV. Since a semiconductor device in a withstand voltage mode is regarded as a capacitor, from the relationship of C=Q/V=qN/V, if a capacitance C is constant (if the device structure is constant), there is a linear relationship between a withstand voltage $BV_{CES}$ and the total number of P-type impurities N. Correction coefficients γ and M are intended to correct influences of the material, two- or three-dimensional effects and device design (device shape, formation of a diffusion layer or the like), and are extracted using device simulation software. A case of a two-dimensional simulation will be described here.

Figure 3:
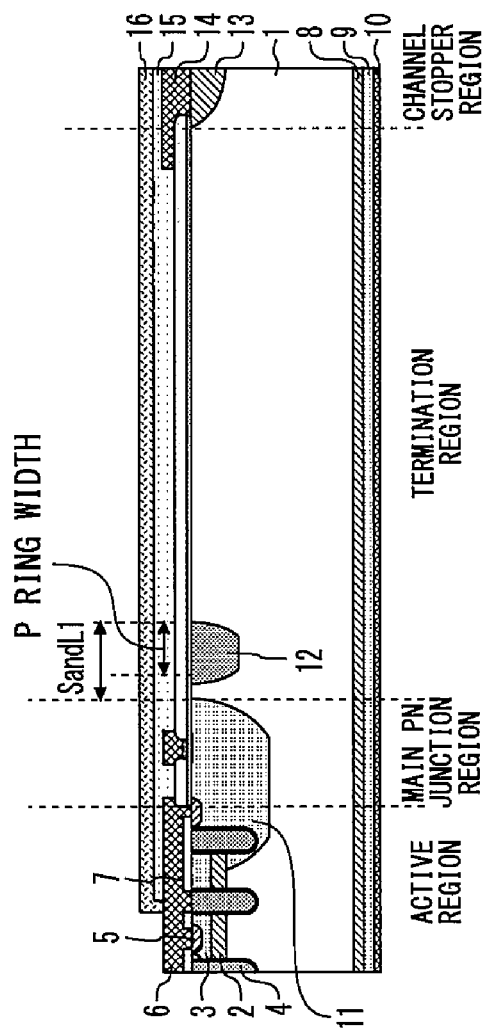
FIG. 3 is a diagram illustrating a model used for a two-dimensional simulation of the correction coefficients γ and M.
Figure 4:
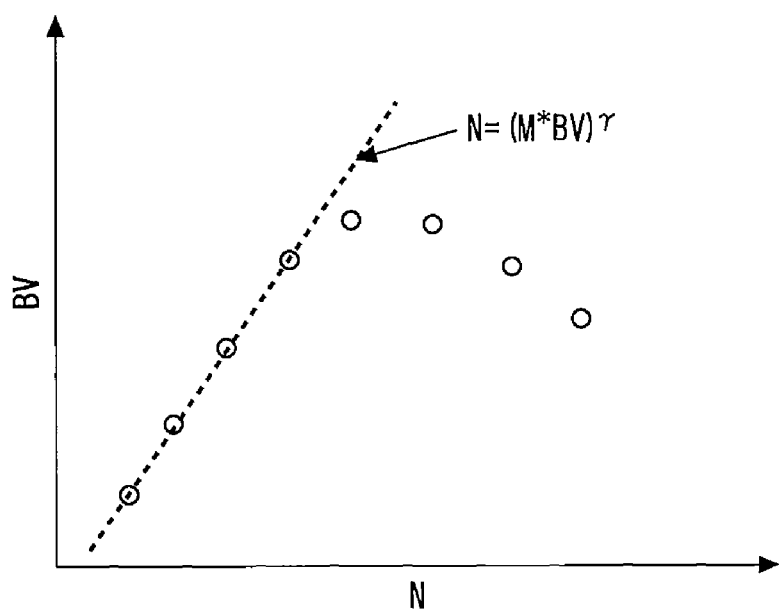
FIG. 4 is a diagram illustrating a relationship between the total number of impurities and a withstand voltage calculated by a two-dimensional simulation.

FIG. 3 is a diagram illustrating a model used for a two-dimensional simulation of the correction coefficients γ and M. First, the model in FIG. 3 is created. Sizes and an impurity distribution of parts other than the P-type ring layers 12 are made to match those of a real chip. The P-type ring layer 12 and the unit in which the P-type ring layer 12 is included may have any width. N as the total number of impurities of the P-type ring layer 12 (=dose×width of P-type ring layer 12) is divided using this model. A withstand voltage under a condition of each total number of impurities N is calculated through a simulation. FIG. 4 is a diagram illustrating a relationship between the total number of impurities and a withstand voltage calculated by a two-dimensional simulation. The correction coefficients γ and M are extracted from data in which the withstand voltage BV and the total number of impurities N have a positive relationship according to $N=(M \times BV)^\gamma$.

Figure 5:
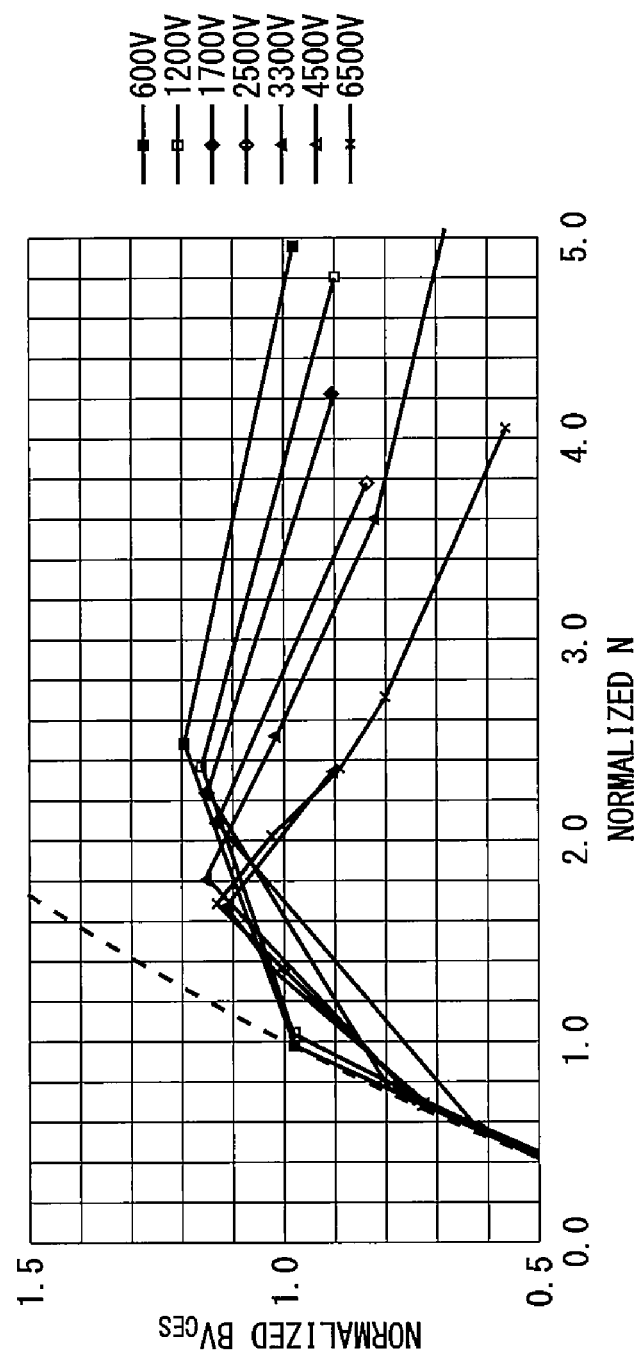
FIG. 5 is a diagram illustrating a relationship between the withstand voltage BVCES and the total number of P-type impurities N when the conditions 2 and 3 are satisfied.

FIG. 5 is a diagram illustrating a relationship between the withstand voltage $BV_{CES}$ and the total number of P-type impurities N when the conditions 2 and 3 are satisfied. The vertical axis shows a value obtained by normalizing the withstand voltage $BV_{CES}$ using a target withstand voltage BV in each withstand voltage class as a reference. The horizontal axis shows a value obtained by normalizing the total number of P-type impurities N and a reference value $N_0$ of normalization is calculated as $N_0=(M \times BV)^\gamma$. As a result of the calculation, if the normalized total number of P-type impurities N is 1 or above, the normalized withstand voltage $BV_{CES}$ becomes 1 or above. Therefore, it has been confirmed that when the conditions 2 and 3 are satisfied, if the condition 1 is further satisfied, it is possible to achieve the target withstand voltage BV.

The condition 2 is a condition for the unit width SandL and the number of units num necessary for each unit to uniformly divide the withstand voltage. Considering one-dimensionally, from a relationship of $E(x)=dV/dx$, the withstand voltage becomes a maximum when $dE/dx=0$, that is, $E(x)$ and the width are constant. As a result, in the case of a one-dimensional step type PN junction (abrupt PN junction), $\frac{1}{2} \cdot E_{cric} \cdot SandL = BV/num$ holds.

The correction coefficient α in the condition 2 is intended to correct influences of two- or three-dimensional effects and device design (shape or the like) and is extracted using device simulation software. Here, a case of two-dimensional simulation will be described.

Figure 6:
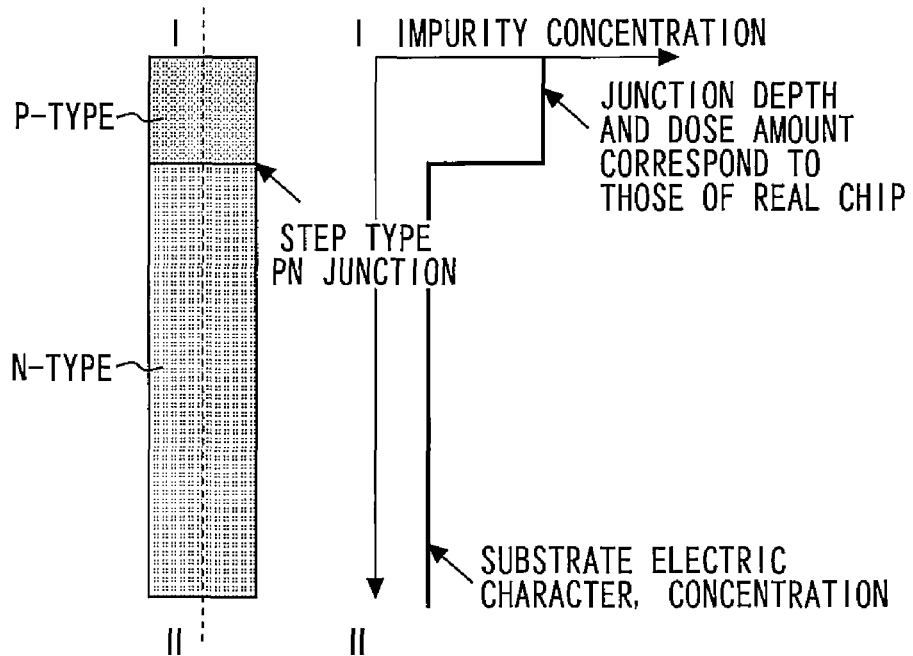
FIG. 6 is a diagram illustrating models used for two-dimensional simulation of the correction coefficient α.
Figure 7:
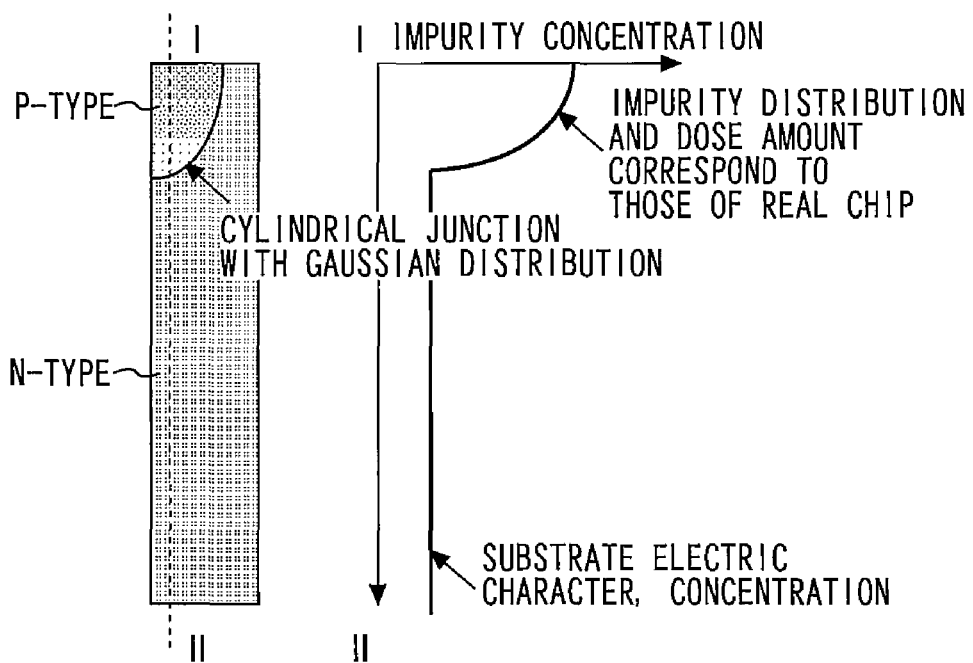
FIG. 7 is a diagram illustrating models used for two-dimensional simulation of the correction coefficient α.

FIG. 6 and FIG. 7 are diagrams illustrating models used for two-dimensional simulation of the correction coefficient α. First, the models in FIG. 6 and FIG. 7 are created. FIG. 6 shows a one-dimensional step type PN junction model. FIG. 7 shows a model of cylindrical junction with Gaussian distribution and this impurity distribution is caused to match that of a real chip. A withstand voltage is calculated using the models in FIG. 6 and FIG. 7. This data is inputted to α=(BV in FIG. 7)/(BV in FIG. 6) to extract the correction coefficient α.

Figure 8:
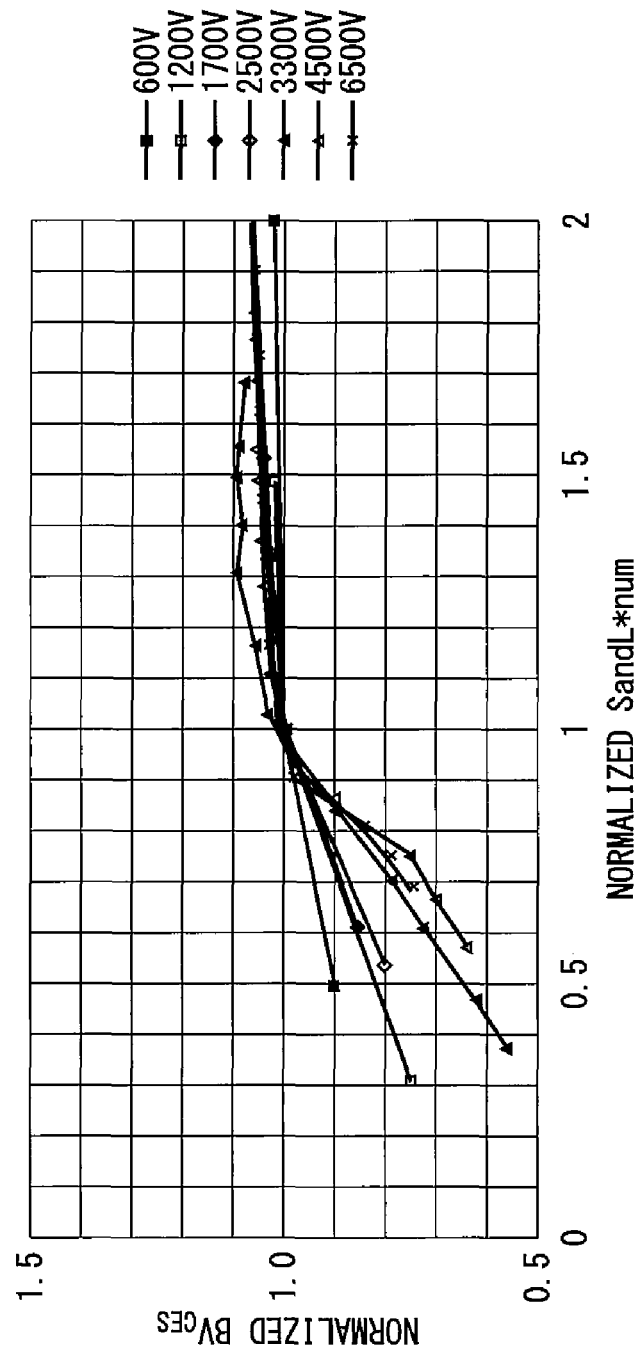
FIG. 8 is a diagram illustrating a relationship between the withstand voltage $BV_{CES}$ and SandL×num when the conditions 1 and 3 are satisfied.

FIG. 8 is a diagram illustrating a relationship between the withstand voltage $BV_{CES}$ and SandL×num when the conditions 1 and 3 are satisfied. The vertical axis shows a value obtained by normalizing the withstand voltage $BV_{CES}$ using the target withstand voltage BV of each withstand voltage class as a reference. The horizontal axis shows a value obtained by normalizing SandL×num and a reference value of normalization $(SandL \times num)_0$ is calculated by $(SandL \times num)_0 \times Ecri = 2 \times \alpha \times BV$. As a result of the calculation, if the normalized SandL×num is 1 or above, the normalized withstand voltage $BV_{CES}$ becomes 1 or above. Therefore, it has been confirmed that when the conditions 1 and 3 are satisfied, if the condition 2 is further satisfied, it is possible to achieve the target withstand voltage BV.

Figure 9:
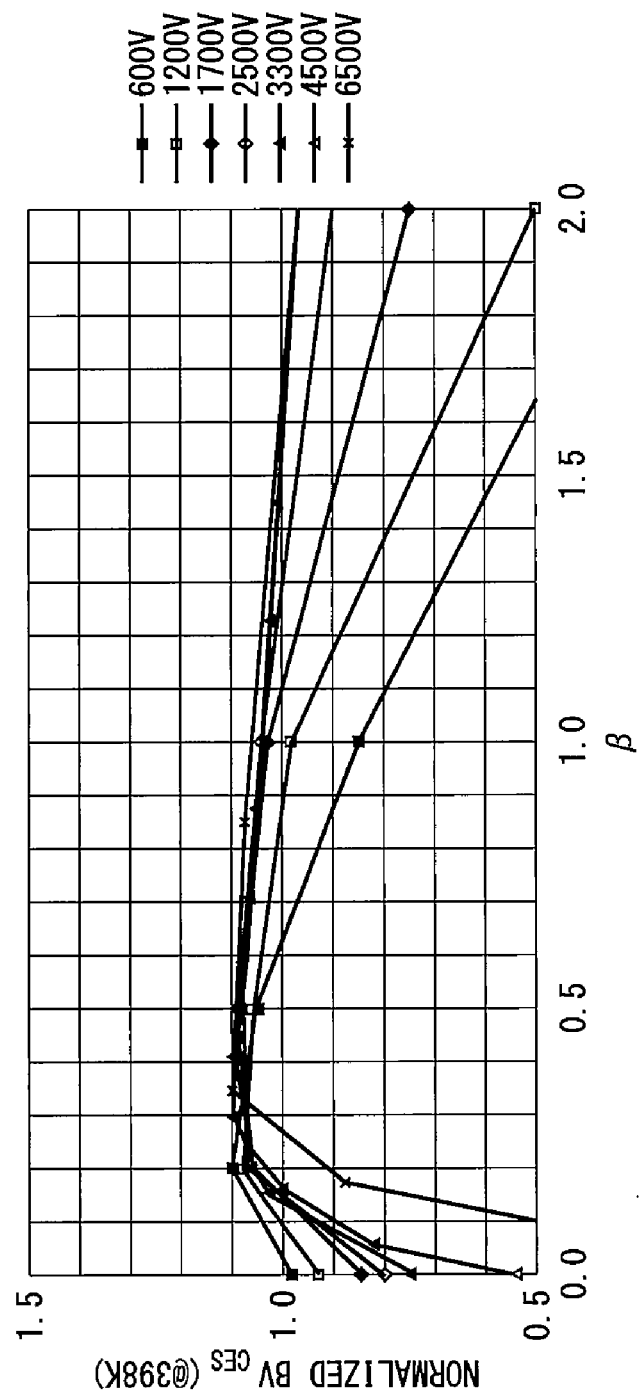
FIG. 9 is a diagram illustrating a relationship between the withstand voltage $BV_{CES}$ and an amount of change β when the conditions 1 and 2 are satisfied.
Figure 10:
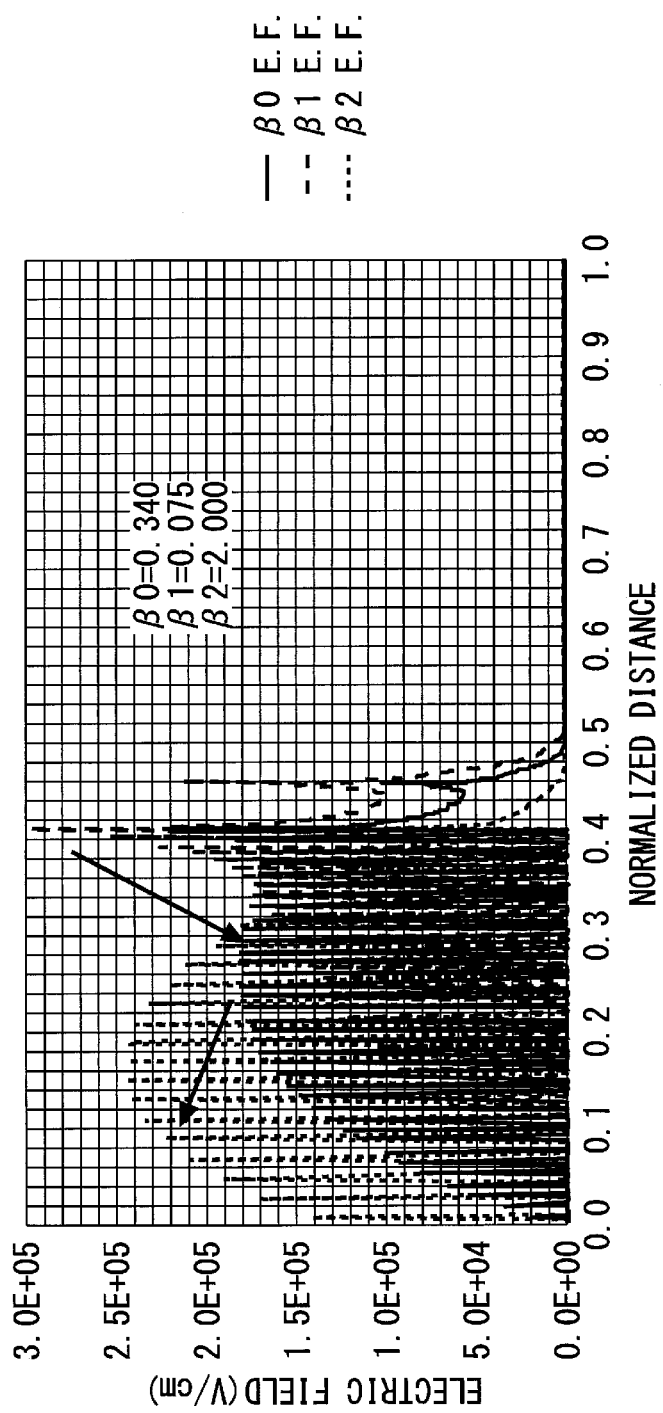
FIG. 10 is a diagram illustrating an electric field distribution on a surface of the termination region (I-II in FIG. 2) of an IGBT of a 4500 V class.

The condition 3 is a condition of a width of the P-type region within the unit necessary to satisfy the target withstand voltage BV. FIG. 9 is a diagram illustrating a relationship between the withstand voltage $BV_{CES}$ and an amount of change β when the conditions 1 and 2 are satisfied. The vertical axis shows a value obtained by normalizing the withstand voltage $BV_{CES}$ using the target withstand voltage BV of each withstand voltage class as a reference. FIG. 10 is a diagram illustrating an electric field distribution on a surface of the termination region (I-II in FIG. 2) of an IGBT of a 4500 V class. β0 is an optimum value of β, β1 is a value smaller than the optimum value and β2 is a value greater than the optimum value. The horizontal axis shows a value obtained by normalizing a distance using a width of the termination region as a reference. When β=β1, an electric field is concentrated on the termination side and when β=β2, the electric field is concentrated on the active region side. Therefore, to exceed the target withstand voltage BV, β needs to be set to 0 to 1.5 to cause the electric field to be concentrated on the center of the termination region. Table 1 shows an allowable range of β.

TABLE 1

| Withstand voltage class | Allowable range of β |
| --- | --- |
| 600 V | 0.0 to 0.6 |
| 1200 V | 0.1 to 0.9 |
| 1700 V | 0.1 to 1.1 |
| 2500 V | 0.1 to 1.3 |
| 3300 V | 0.1 to 1.4 |
| 4500 V | 0.1 to 1.5 |
| 6500 V | 0.2 to 1.5 |

Figure 11:
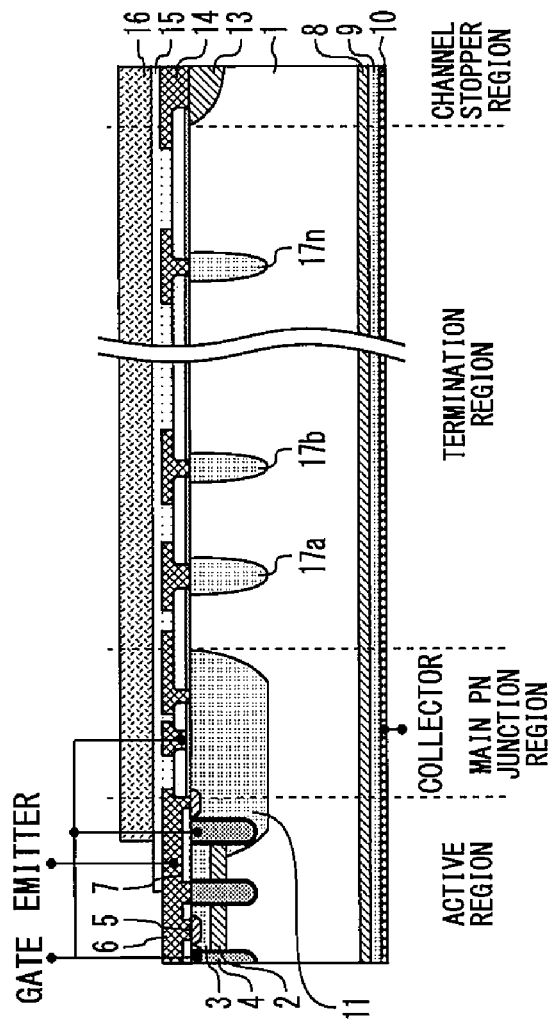
FIG. 11 is a cross-sectional view illustrating a semiconductor device according to comparative example 1.

Next, effects of the present embodiment will be described in comparison with comparative examples. FIG. 11 is a cross-sectional view illustrating a semiconductor device according to comparative example 1. A plurality of P-type ring layers 17a to 17n are provided in the termination region. A concentration, depth, the number or the like of the P-type ring layers 17a to 17n are design parameters which vary depending on a withstand voltage to be maintained. The electric field in the horizontal direction is divided at intervals by portions of the N-type drift layer 1 between the plurality of P-type ring layers 17a to 17n. However, the chip area increases because the number of the plurality of P-type ring layers 17a to 17n needs to be increased to increase the withstand voltage. Moreover, a high electric field is generated in the outermost P-type ring layer 17n having a high curvature, which limits an upper limit of the withstand voltage, causing the turn-off breaking capability to deteriorate.

Figure 12:
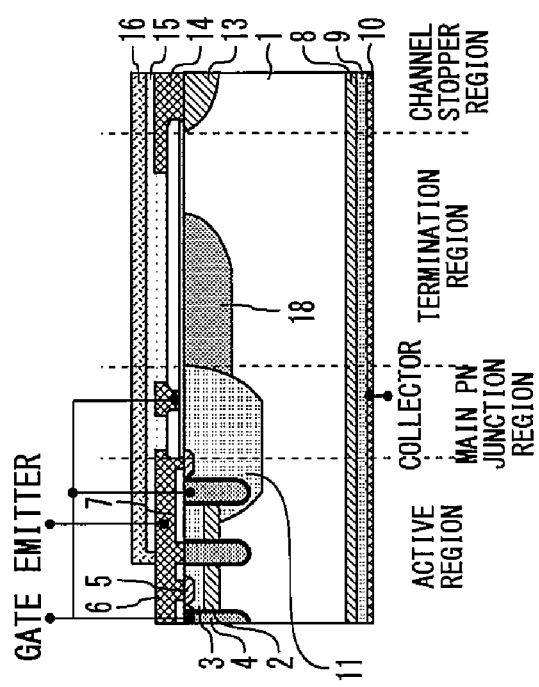
FIG. 12 is a cross-sectional view illustrating a semiconductor device according to comparative example 2.

FIG. 12 is a cross-sectional view illustrating a semiconductor device according to comparative example 2. One P-type layer 18 is provided in the termination region. A concentration, depth or the like of the P-type layer 18 are design parameters which vary depending on a withstand voltage to be maintained. A surface concentration of the P-type layer 18 decreases toward the outside of the termination region. However, since the allowable range of the dose of the P-type layer 18 is narrow, process control is difficult, resulting in a high defect rate. When the dose of the P-type layer 18 is outside the allowable range, a high electric field is generated on the active region side of the P-type layer 18 or at an end of the outside, limiting an upper limit of the withstand voltage.

Figure 13:
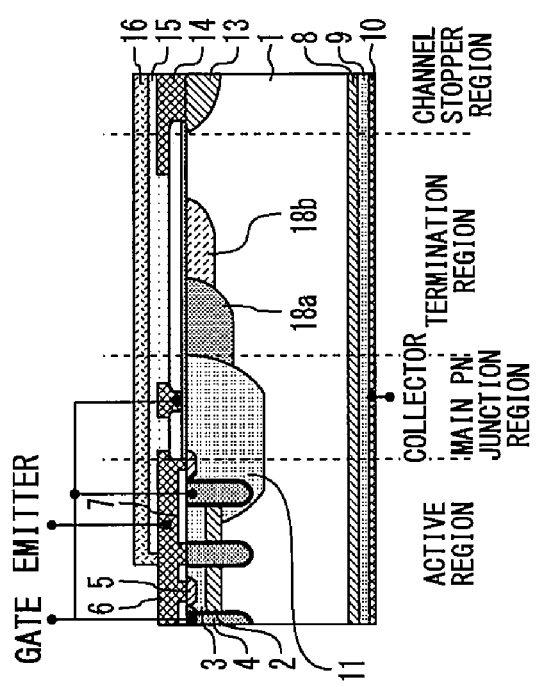
FIG. 13 is a cross-sectional view illustrating a semiconductor device according to comparative example 3.

FIG. 13 is a cross-sectional view illustrating a semiconductor device according to comparative example 3. A plurality of P-type layers 18a and 18b are provided in the termination region. A concentration, depth or the like of the P-type layers 18a and 18b are design parameters which vary depending on a withstand voltage to be maintained. Surface concentrations of the P-type layers 18a and 18b decrease toward the outside of the termination region and the depths decrease toward the outside of the termination region. A plurality of photolithography processes and an ion implantation step are necessary to form these P-type layers 18a and 18b, which makes the manufacturing process more complicated and increases product cost.

Figure 14:
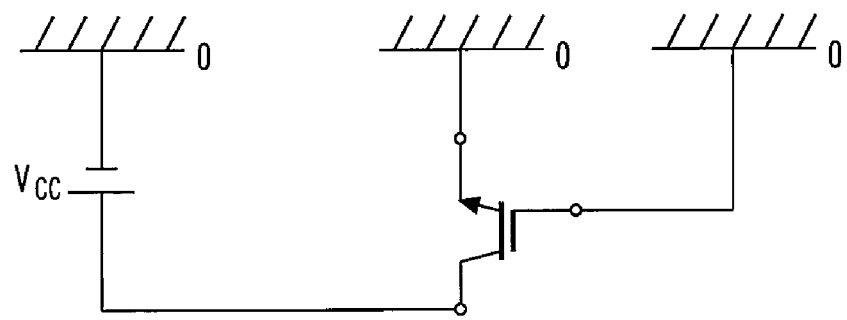
FIG. 14 is a diagram illustrating an evaluation circuit diagram used for an evaluation experiment of withstand voltage characteristics.
Figure 15:
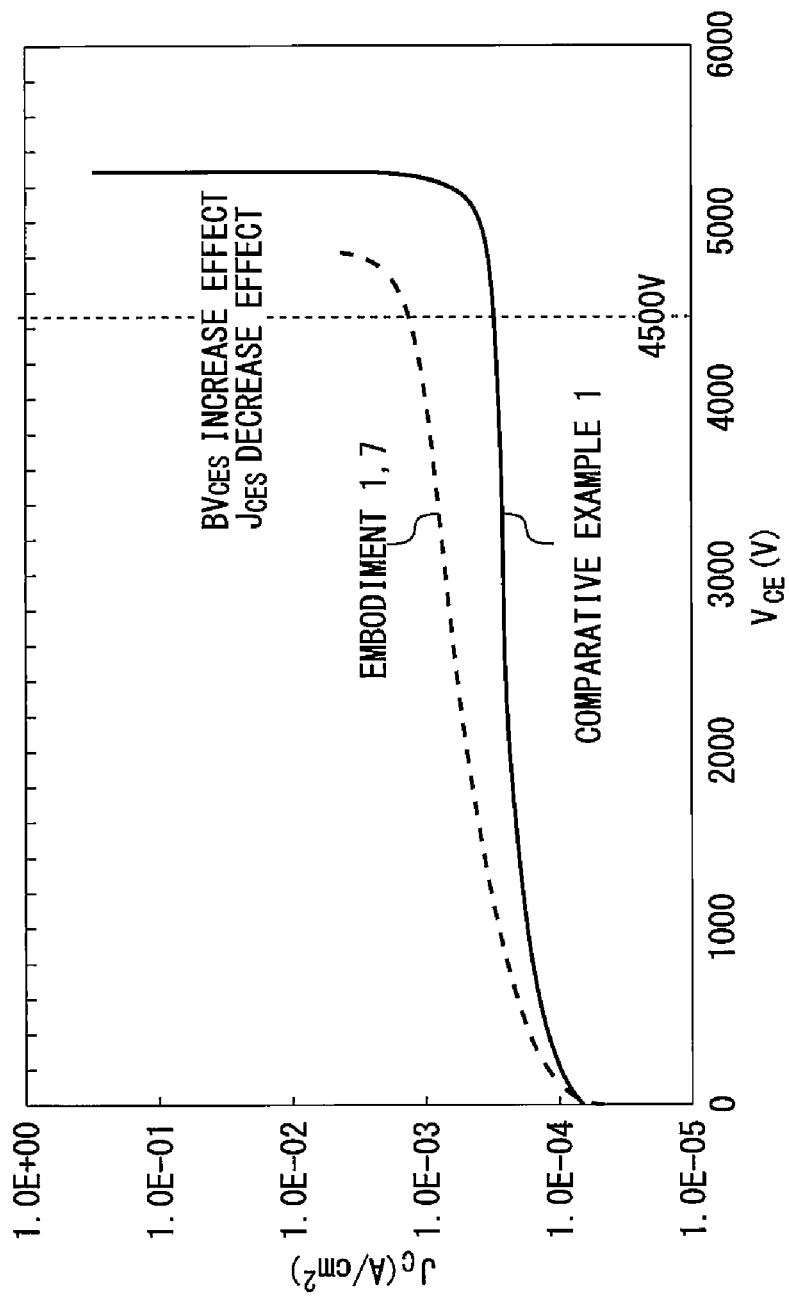
FIG. 15 is a diagram illustrating evaluation results of the withstand voltage leakage current characteristics.

FIG. 14 is a diagram illustrating an evaluation circuit diagram used for an evaluation experiment of withstand voltage characteristics. A device of an IGBT structure having a withstand voltage of 4500 V is used. As evaluation conditions, Vcc is 4500 V, VGE is 0 V, temperature is 398 K, and a DC mode is used. Withstand voltage leakage current characteristics are evaluated under these evaluation conditions. FIG. 15 is a diagram illustrating evaluation results of the withstand voltage leakage current characteristics. The leakage current $J_{CES}$ (@4500 V) in Embodiment 1 decreased by 90% compared to comparative example 1.

Figure 16:
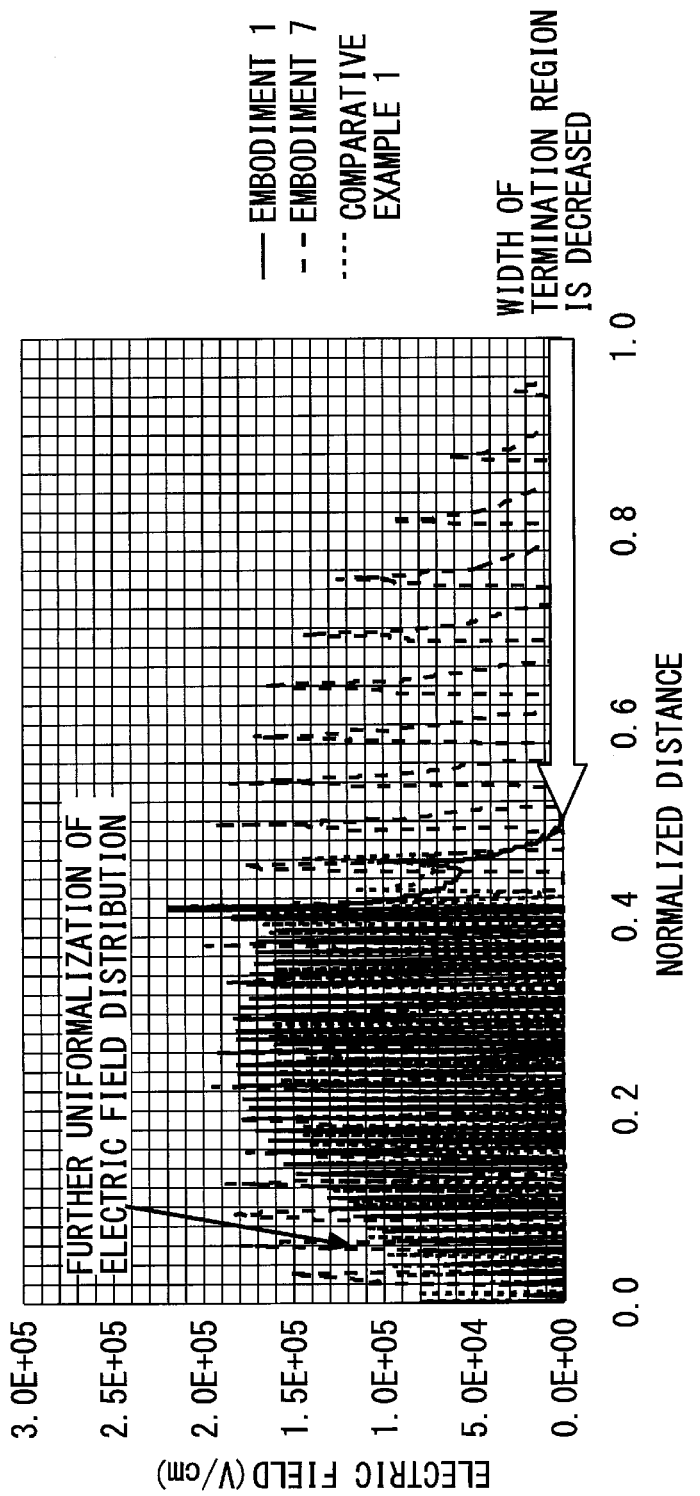
FIG. 16 is a diagram illustrating an electric field distribution on a surface of the termination region (I-II in FIG. 2) when the same voltage is applied in a simulation internal analysis (@VCE=4500 V).

FIG. 16 is a diagram illustrating an electric field distribution on a surface of the termination region (I-II in FIG. 2) when the same voltage is applied in a simulation internal analysis (@VCE=4500 V). The width of the termination region in Embodiment 1 can be reduced by 50% compared to comparative example 1. It is possible to suppress the surface electric field in the termination region, and thereby reduce a drift current caused by a high electric field and suppress local impact ionization.

Figure 17:
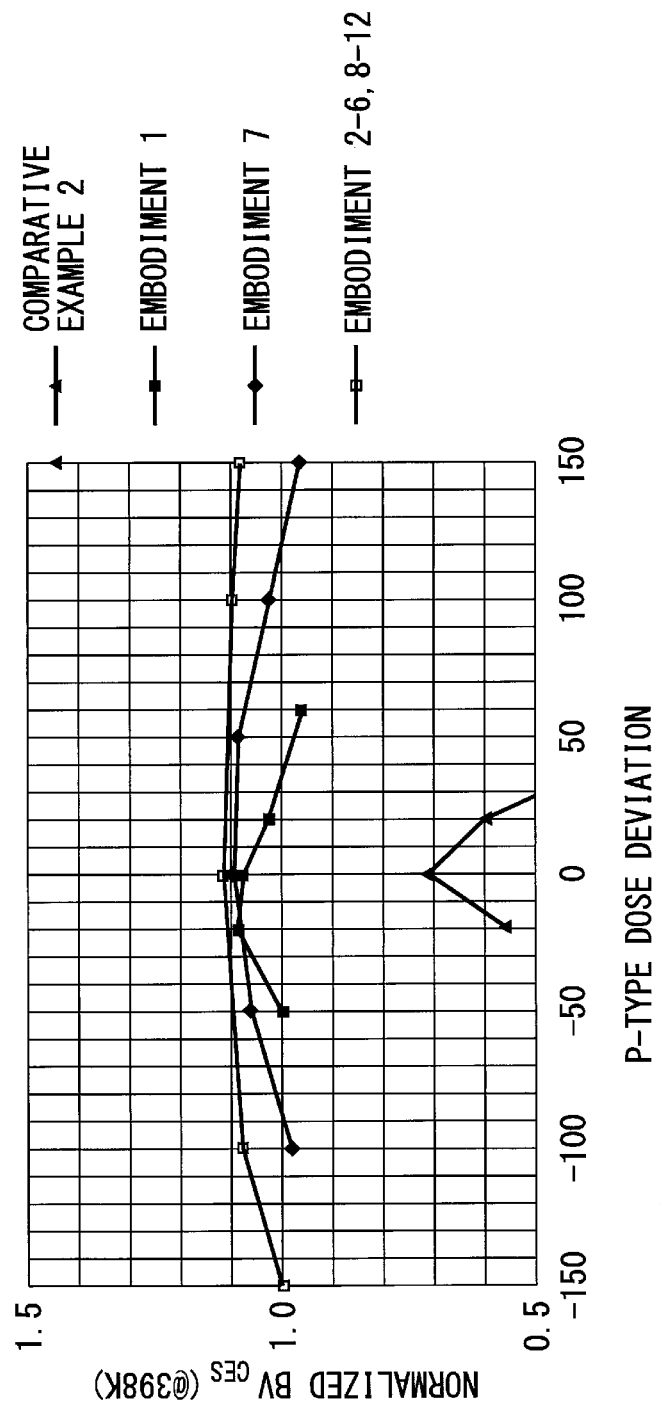
FIG. 17 is a diagram illustrating a relationship between a withstand voltage and a P-type dose deviation.

FIG. 17 is a diagram illustrating a relationship between a withstand voltage and a P-type dose deviation. A device of an IGBT structure having a withstand voltage of 4500 V is used. The vertical axis shows a value obtained by normalizing the withstand voltage $BV_{CES}$ using a target withstand voltage BV as a reference. The horizontal axis shows a deviation ratio value of the dose. The allowable range of the dose is Embodiments 2 to 6, 8 to 12>Embodiment 7>Embodiment 1>comparative example 2. Therefore, the present embodiment can expand the allowable range of the P-type dose compared to comparative example 2.

Figure 18:
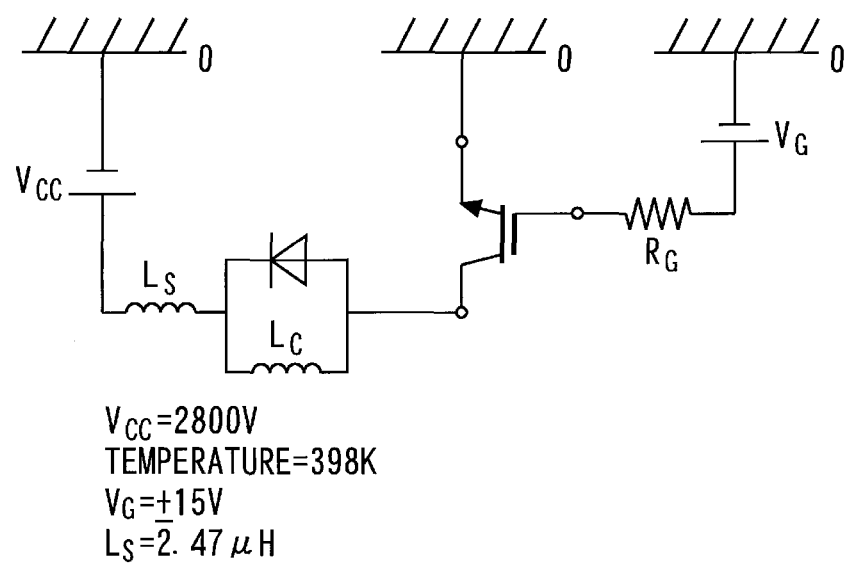
FIG. 18 is a diagram illustrating an evaluation circuit used for an evaluation experiment of turn-off characteristics.
Figure 19:
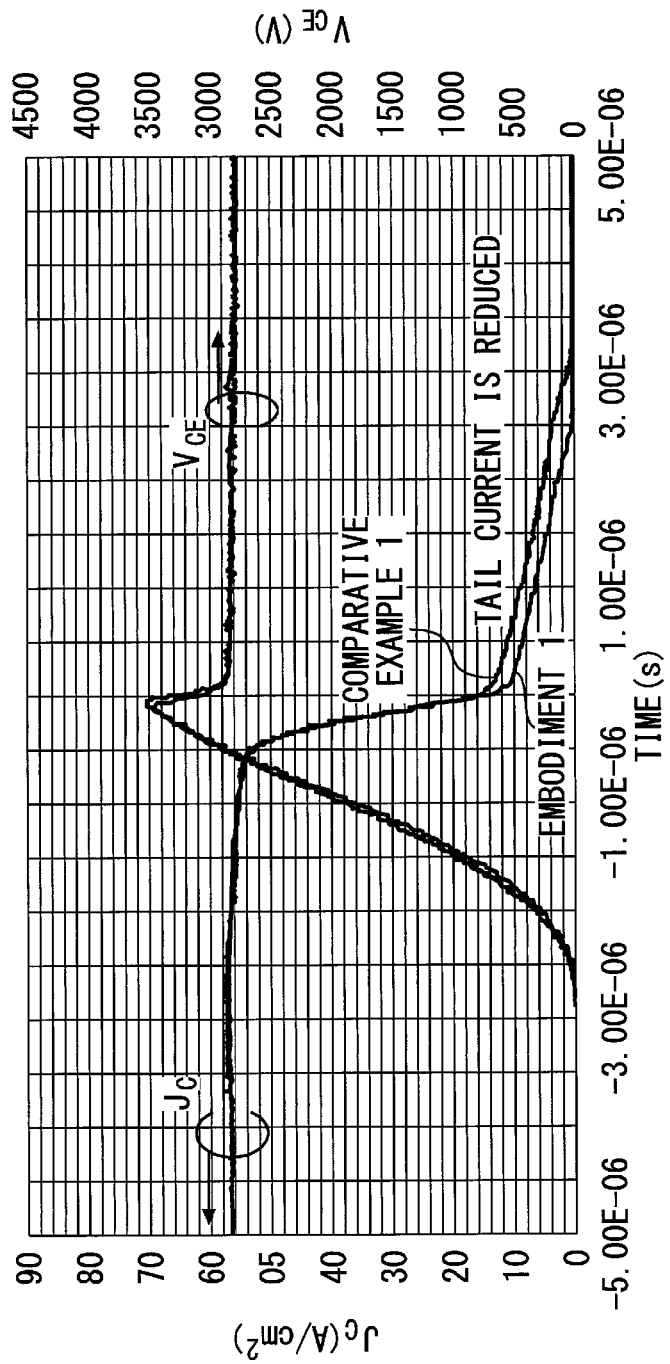
FIG. 19 is a diagram illustrating evaluation results of the turn-off characteristics.

FIG. 18 is a diagram illustrating an evaluation circuit used for an evaluation experiment of turn-off characteristics. A device of an IGBT structure having a withstand voltage of 4500 V is used. As evaluation conditions, Vcc is 2800 V, Ls=2.47 µH, temperature is 398 K, and JC is 56 A/cm². The turn-off characteristics are evaluated under these evaluation conditions. FIG. 19 is a diagram illustrating evaluation results of the turn-off characteristics. The temperature is 398 K. A turn-off loss is substantially constant, the width of the termination region decreases and the number of holes from the termination region during turn-off operation decreases in Embodiment 1 compared to comparative example 1. For this reason, it is possible to reduce a tail current.

Figure 20:
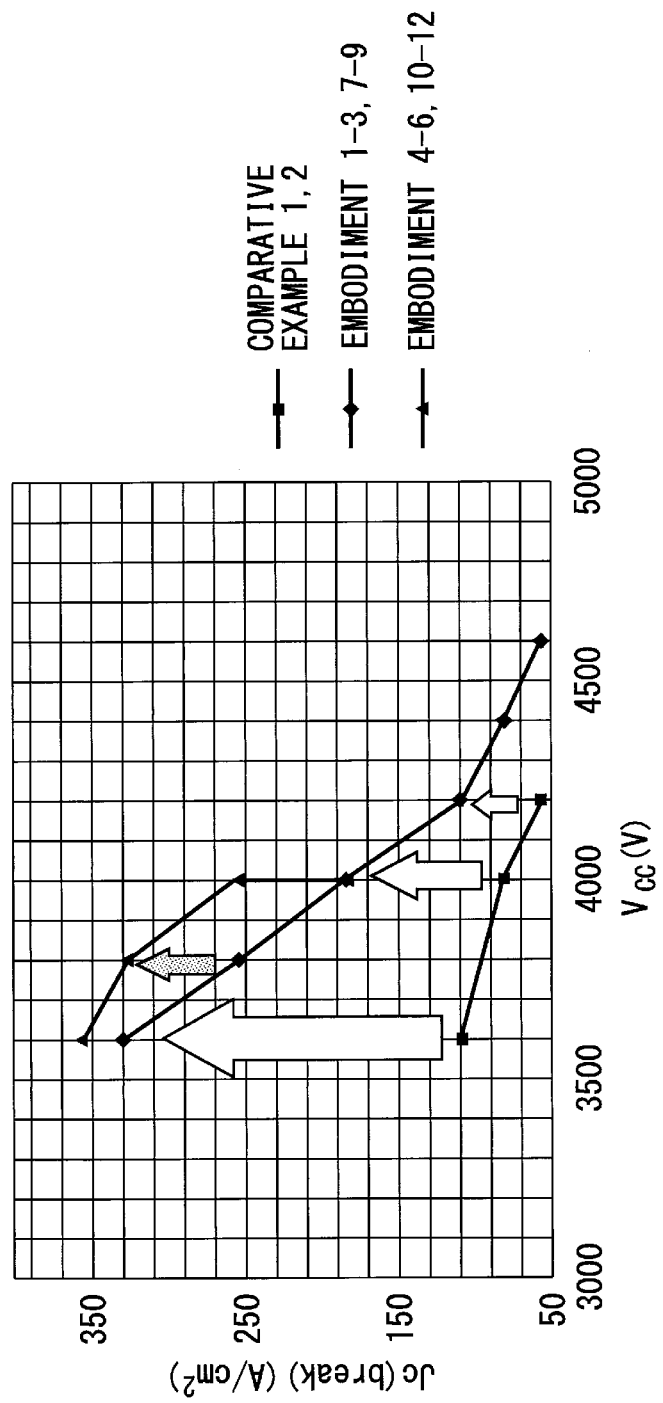
FIG. 20 is a diagram illustrating a relationship between turn-off breaking capability (Jc (break)) and VCC.

FIG. 20 is a diagram illustrating a relationship between turn-off breaking capability ($J_c$ (break)) and $V_{CC}$. A device of an IGBT structure having a withstand voltage of 4500 V is used. With dispersion/uniformalization of an electric field distribution in the termination region, $J_c$(break) when $V_{cc}$=3600 V increases and turn-off breaking capability improves in Embodiment 1 compared to comparative example 1. Moreover, a PN junction curvature in the P-type ring layer is reduced, and therefore the turn-off breaking capability further improves in Embodiments 4 to 6, 10 to 12.

Thus, in the present embodiment, it is possible to reduce the chip area, improve the turn-off breaking capability and widen the allowable range of P-type dose without deteriorating electric characteristics (ON voltage, withstand voltage, turn-off loss, short circuit resistance or the like). Moreover, since a plurality of P-type ring layers 12a to 12f can be formed collectively, these can be manufactured in simple manufacturing processes.

Embodiment 2

Figure 21:
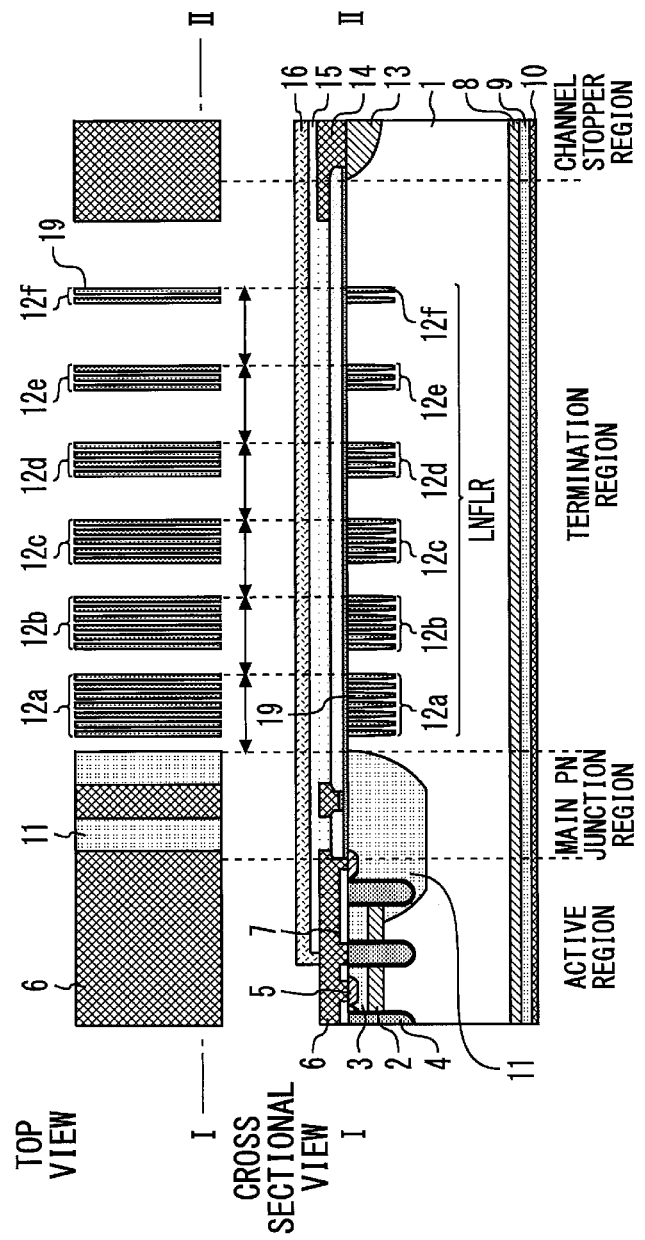
FIG. 21 shows a top view and a cross-sectional view illustrating a semiconductor device according to Embodiment 2 of the present invention.

FIG. 21 shows a top view and a cross-sectional view illustrating a semiconductor device according to Embodiment 2 of the present invention. Embodiment 2 is different from Embodiment 1 in the structure of the P-type ring layers 12a to 12f, and the P-type ring layers 12a to 12f include a plurality of striped structures 19 regularly arranged in a plan view. An electric field is concentrated on a boundary of each striped structure 19 in the P-type ring layers 12a to 12f. It is possible to suppress high local electric fields by dividing the electric field distribution by making full use of a field limiting ring effect. Moreover, since a withstand voltage is distributed to the boundary of the striped structure 19, the depleted layer does not extend to the inside of the striped structure 19. This makes it possible to prevent complete depletion of impurity in the striped structure 19 and reduce the withstand voltage dependency on the dose of P-type impurity in the ring region LNFLR.

Embodiment 3

Figure 22:
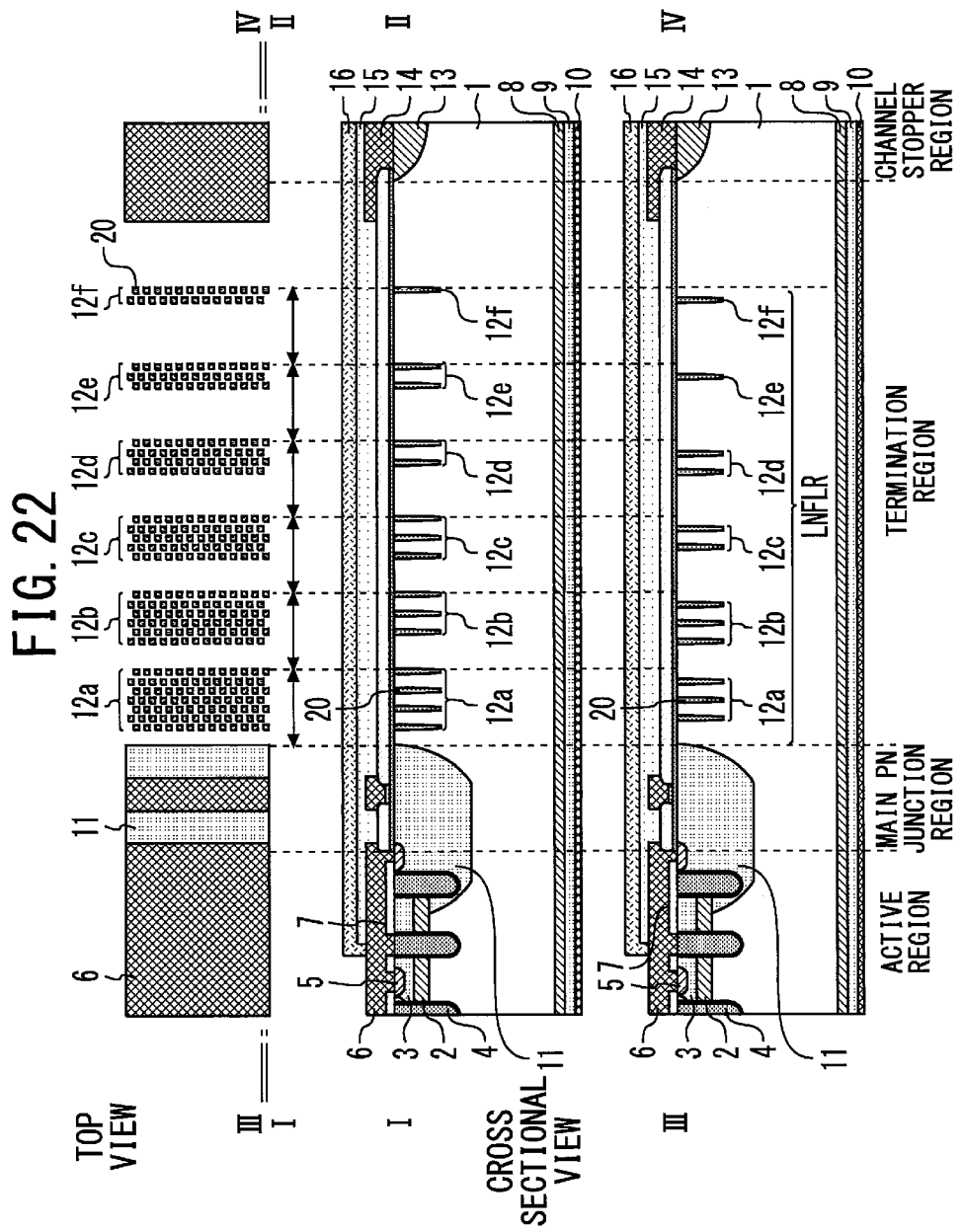
FIG. 22 shows a top view and a cross-sectional view illustrating a semiconductor device according to Embodiment 3 of the present invention.

FIG. 22 shows a top view and a cross-sectional view illustrating a semiconductor device according to Embodiment 3 of the present invention. Embodiment 3 is different from Embodiment 1 in the structures of the P-type ring layers 12a to 12f, and the P-type ring layers 12a to 12f include a plurality of dotted structures 20 regularly arranged in a plan view. An electric field is concentrated on a boundary of each dotted structure 20 in the P-type ring layers 12a to 12f. It is possible to suppress high local electric fields by dividing the electric field distribution by making full use of a field limiting ring effect. Moreover, since a withstand voltage is distributed to the boundary of the dotted structure 20, the depleted layer does not extend to the inside of the dotted structure 20. This makes it possible to prevent complete depletion of impurity in the dotted structure 20 and reduce the withstand voltage dependency on the dose of P-type impurity in the ring region LNFLR. Note that the dotted structure 20 is square in the present embodiment, but the shape of the dotted structure 20 is not limited to this.

Embodiment 4

Figure 23:
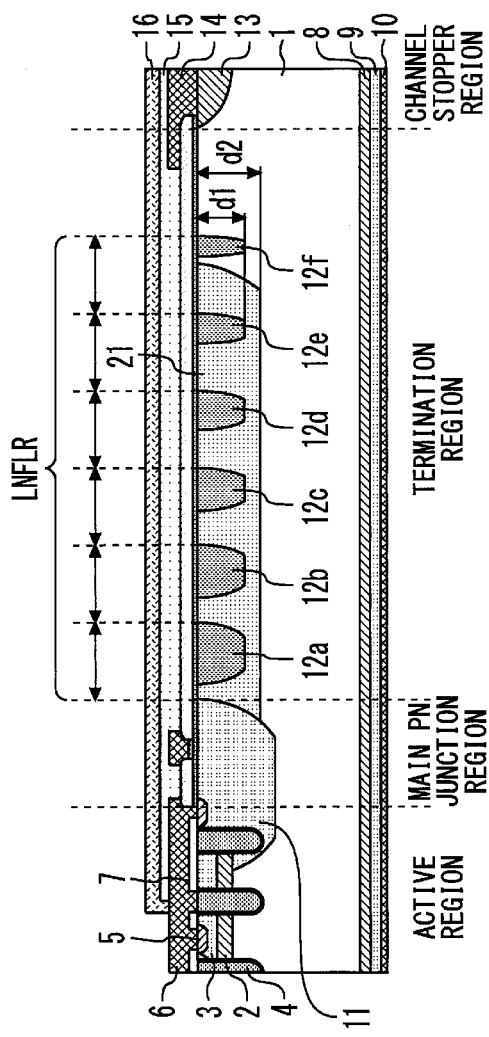
FIG. 23 is a cross-sectional view illustrating a semiconductor device according to Embodiment 4 of the present invention.

FIG. 23 is a cross-sectional view illustrating a semiconductor device according to Embodiment 4 of the present invention. A P-type layer 21 that overlaps with at least part of the ring region LNFLR in the termination region is provided in addition to the configuration of Embodiment 1. A surface concentration of the P-type layer 21 is smaller than a surface concentration of the P-type ring layers 12a to 12f. A depth d2 of the P-type layer 21 is greater than a depth d1 of the P-type ring layers 12a to 12f.

The following condition is satisfied assuming that the number of P-type impurities in the P-type ring layers 12a to 12f in the ring region LNFLR is N1 and the number of P-type impurities in the P-type layer 21 is N2.

$$N1+N2 \geq (M \times BV)^\gamma, M=10^4 \text{ to } 10^5, \gamma=0.55 \text{ to } 1.95$$

In the present embodiment, a part carrying a voltage is an outermost perimeter of the P-type layer 21 of a low PN curvature or a boundary of the P-type ring layers 12a to 12f in the ring region LNFLR. For this reason, it is possible to reduce/disperse concentration of the electric field. As a result, it is possible to further improve the turn-off breaking capability and reduce the surface electric field.

Embodiment 5

Figure 24:
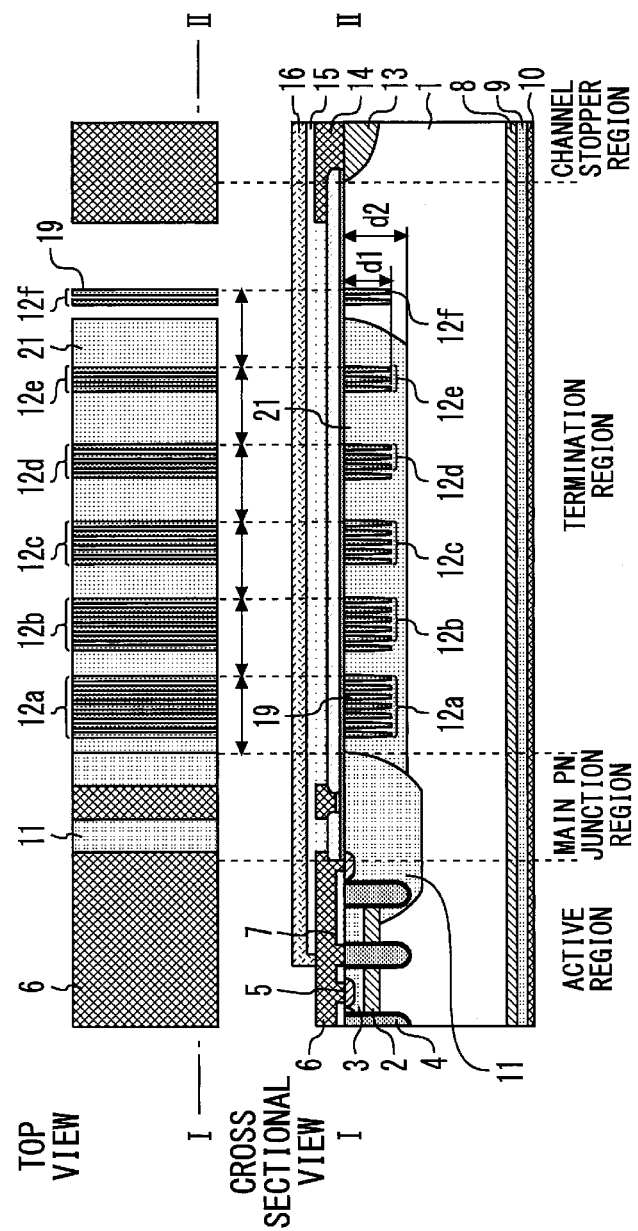
FIG. 24 shows a top view and a cross-sectional view illustrating a semiconductor device according to Embodiment 5 of the present invention.

FIG. 24 shows a top view and a cross-sectional view illustrating a semiconductor device according to Embodiment 5 of the present invention. The present embodiment is provided with features of both Embodiments 2 and 4, and can obtain effects of both embodiments.

Embodiment 6

Figure 25:
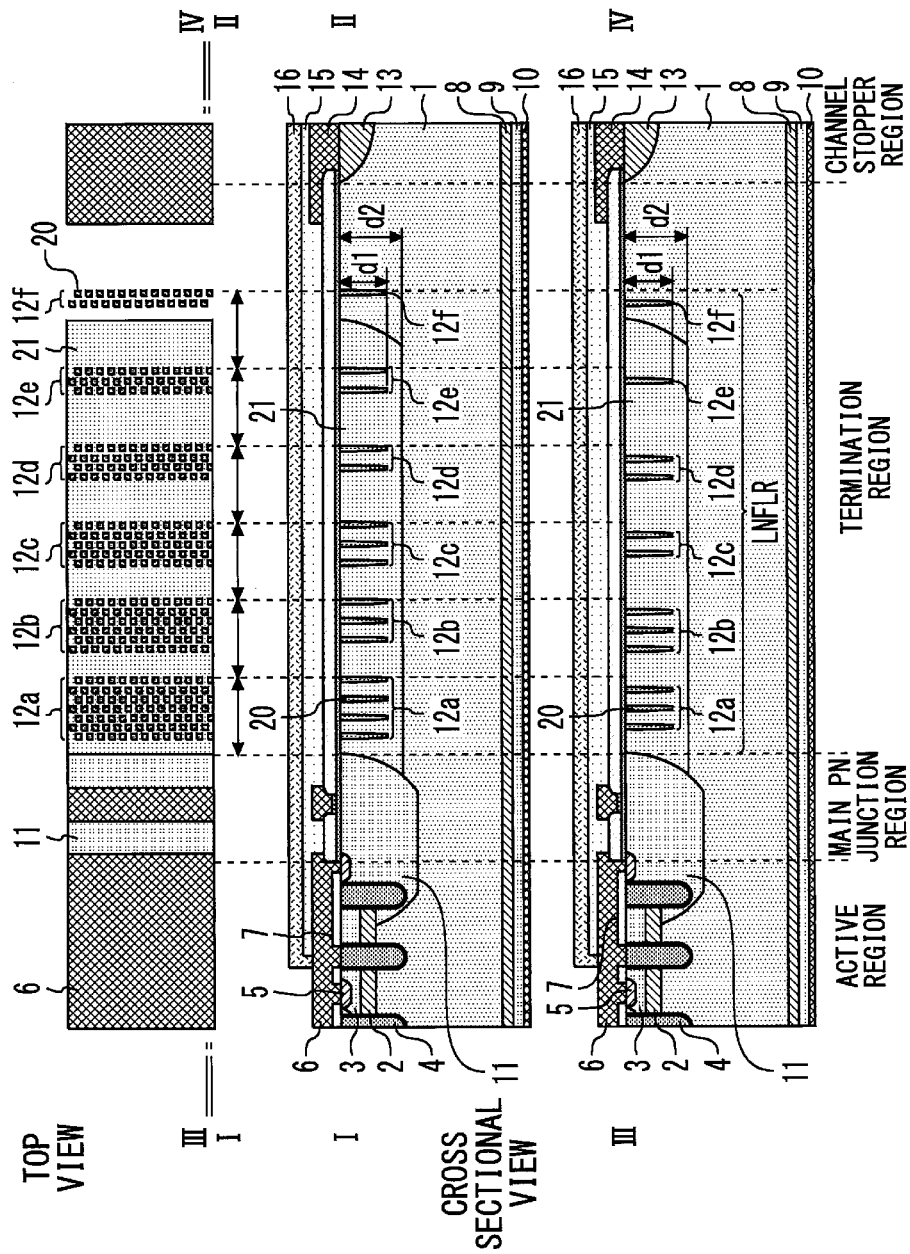
FIG. 25 shows a top view and a cross-sectional view illustrating a semiconductor device according to Embodiment 6 of the present invention.

FIG. 25 shows a top view and a cross-sectional view illustrating a semiconductor device according to Embodiment 6 of the present invention. The present embodiment is provided with features of both Embodiments 3 and 4, and can obtain effects of both embodiments.

Embodiment 7

Figure 26:
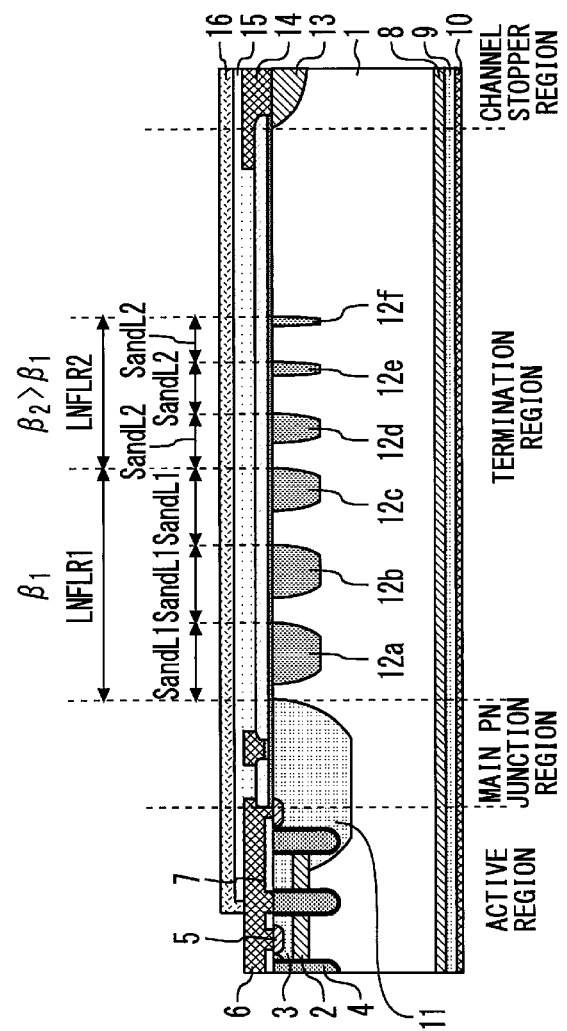
FIG. 26 is a cross-sectional view illustrating a semiconductor device according to Embodiment 7 of the present invention.

FIG. 26 is a cross-sectional view illustrating a semiconductor device according to Embodiment 7 of the present invention. Unlike Embodiment 1, the termination region includes a plurality of ring regions LNFLR1 and LNFLR2. In those ring regions, a plurality of ring-shaped P-type ring layers 12a to 12f are regularly arranged in line. Each ring region is divided into a plurality of units which include the plurality of ring-shaped P-type ring layers respectively 12a to 12f. The width of each unit is constant within the same ring region. However, the ring regions LNFLR1 and LNFLR2 have mutually different unit widths Sand1 and Sand2.

When it is assumed that the total number of P-type impurities in an i-th ring region from the active region outward among the plurality of ring regions is N(i), the target withstand voltage is BV [V], the withstand voltage supported by the i-th ring region LNFLR is BV(i) [V], the width of each unit of the i-th ring region LNFLR is SandL(i) [μm], and the number of units in the i-th ring region LNFLR is num(i), the following relationships are satisfied.

$N(i) \geq (M \times BV(i))^\gamma, M=10^4$ to $10^5, \gamma=0.55$ to $1.95$ $\Sigma[SandL(i) \times num(i) \times Emax(i)] \geq 2 \times \alpha \times BV$ $BV=\Sigma BV(i), Emax(i) \leq Ecri, Ecri=2.0$ to $3.0 \times 10^5$ [V/cm], $\alpha=10^0$ to $10^1, \beta(i+1) > \beta(i)$ In the ring regions LNFLR1 and LNFLR2, the widths SandL1 and SandL2 of the P-type ring layers 12a to 12f of the plurality of units linearly decrease toward the outside of the termination region. A change rate β1 in the ring region LNFLR1 and a change rate β2 in the ring region LNFLR2 satisfy β2>β1>0.

The significances of the above conditions are similar to those of the conditions 1 to 3 in Embodiment 1. In the present embodiment, the termination region is designed step by step and an LNFLR structure is formed in each part according to the above-described rule. This allows an electric field distribution to be formed more uniformly than in Embodiment 1, and can thereby further expand the process allowable range.

Figure 27:
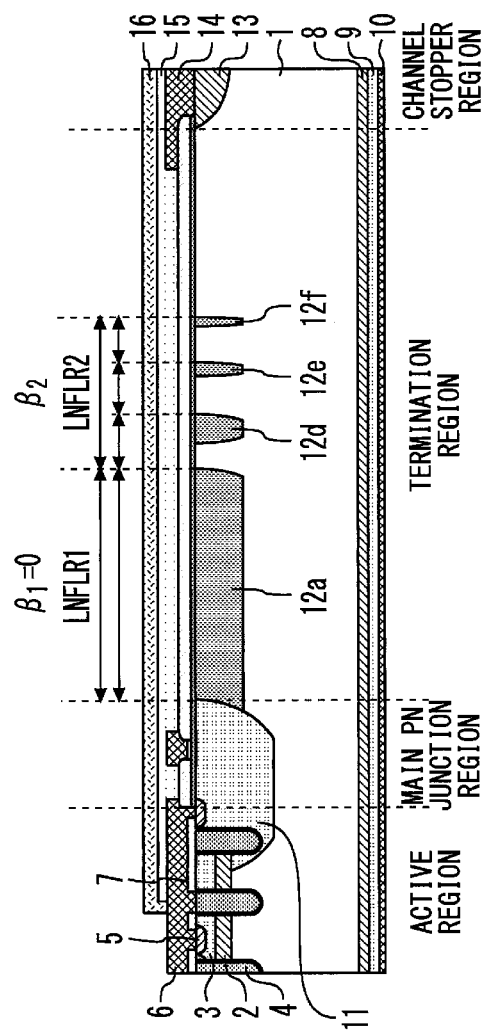
FIG. 27 is a cross-sectional view illustrating a modification of the semiconductor device according to Embodiment 7 of the present invention.

FIG. 27 is a cross-sectional view illustrating a modification of the semiconductor device according to Embodiment 7 of the present invention. In this modification, the change rate is β2>β1=0. Similar effects can be obtained in this case as well.

Embodiment 8

Figure 28:
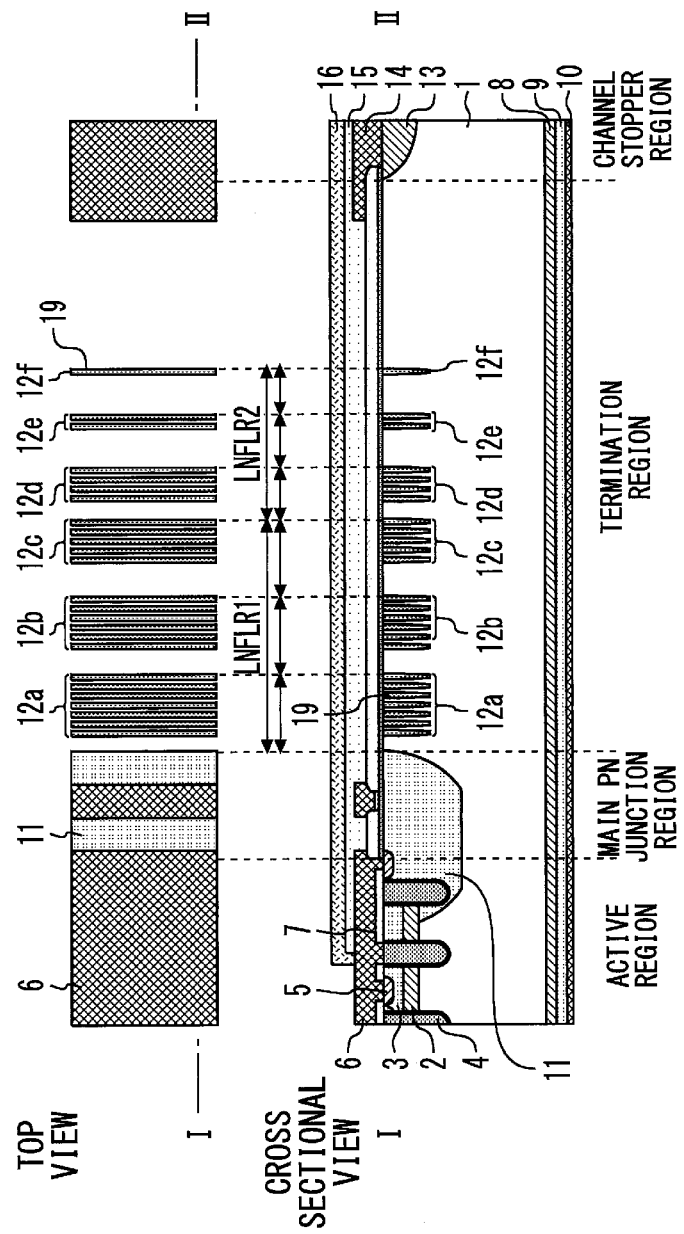
FIG. 28 is a cross-sectional view of a semiconductor device according to Embodiment 8 of the present invention.

FIG. 28 is a cross-sectional view of a semiconductor device according to Embodiment 8 of the present invention. Embodiment 8 is different from Embodiment 7 in the structure of the P-type ring layers 12a to 12f and the P-type ring layers 12a to 12f have a plurality of striped structures 19 regularly arranged in a plan view. This can reduce dependency of the withstand voltage on the dose of P-type impurity within the ring region LNFLR as in the case of Embodiment 2.

Embodiment 9

Figure 29:
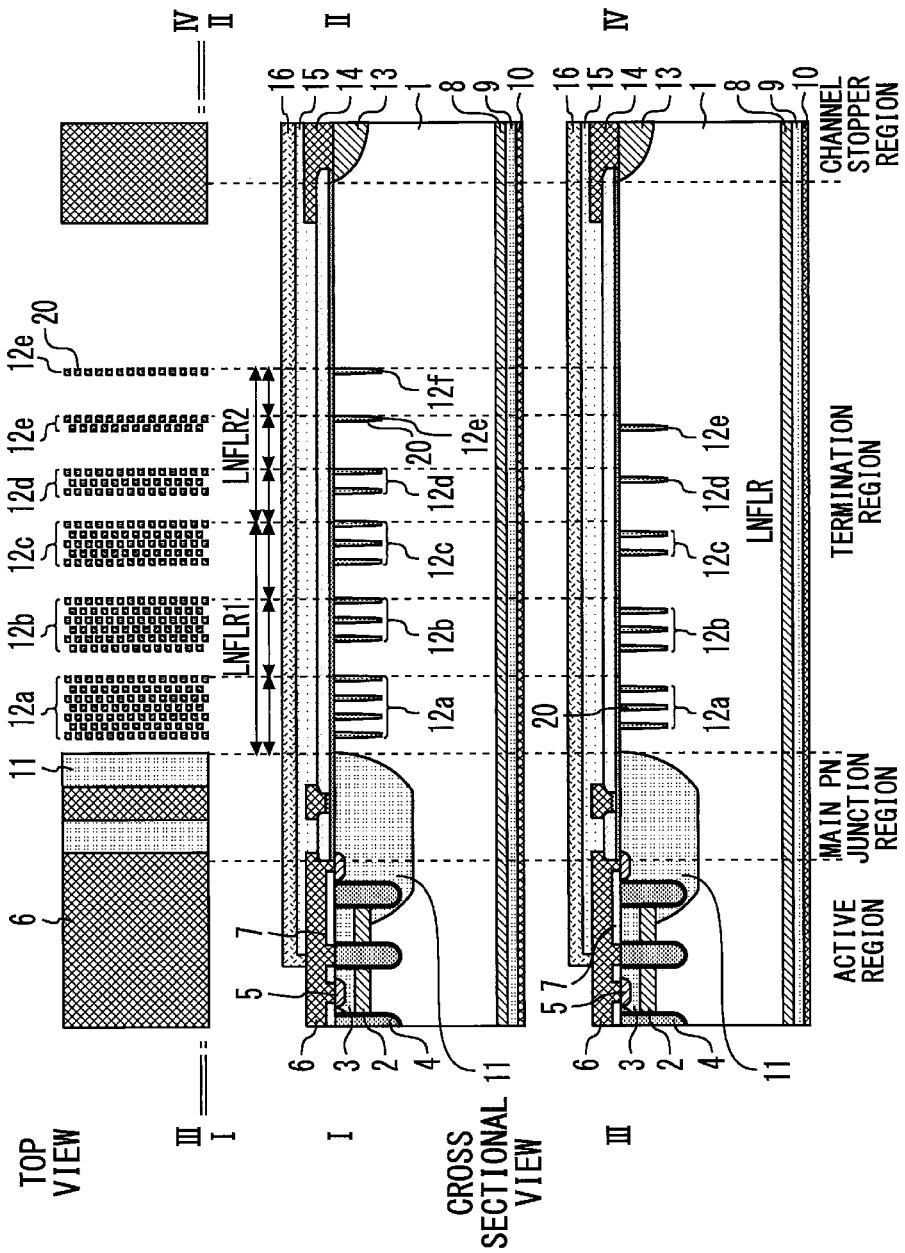
FIG. 29 is a cross-sectional view illustrating a semiconductor device according to Embodiment 9 of the present invention.

FIG. 29 is a cross-sectional view illustrating a semiconductor device according to Embodiment 9 of the present invention. Embodiment 9 is different from Embodiment 7 in the structure of the P-type ring layers 12a to 12f and the P-type ring layers 12a to 12f have a plurality of dotted structures 20 regularly arranged in a plan view. This can reduce dependency of the withstand voltage on the dose of P-type impurity within the ring region LNFLR as in the case of Embodiment 3.

Embodiment 10

Figure 30:
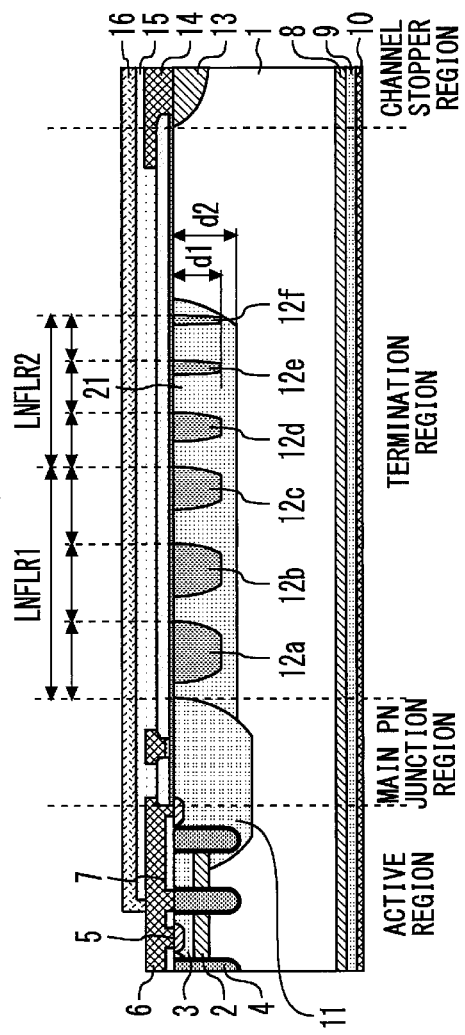
FIG. 30 is a cross-sectional view illustrating a semiconductor device according to Embodiment 10 of the present invention.

FIG. 30 is a cross-sectional view illustrating a semiconductor device according to Embodiment 10 of the present invention. In addition to the configuration of Embodiment 7, a P-type layer 21 which at least partially overlaps with the ring region LNFLR is provided in the termination region. The surface concentration of the P-type layer 21 is smaller than the surface concentration of the P-type ring layers 12a to 12f. The depth of the P-type layer 21 is greater than the depth of the P-type ring layers 12a to 12f.

When it is assumed that the number of P-type impurities in the P-type ring layers 12a to 12f in the ring region LNFLR is N1 and the number of P-type impurities in the P-type layer 21 is N2, the following condition is satisfied.

$N1+N2 \geq (M \times BV)^\gamma, M=10^4$ to $10^5, \gamma=0.55$ to $1.95$

In the present embodiment, a portion carrying a voltage forms the outermost perimeter of the P-type layer 21 with a low PN curvature or a boundary of the P-type ring layers 12a to 12f in the ring region LNFLR. For this reason, it is possible to reduce/disperse concentration of an electric field. As a result, it is possible to further improve turn-off breaking capability and reduce the surface electric field.

Embodiment 11

Figure 31:
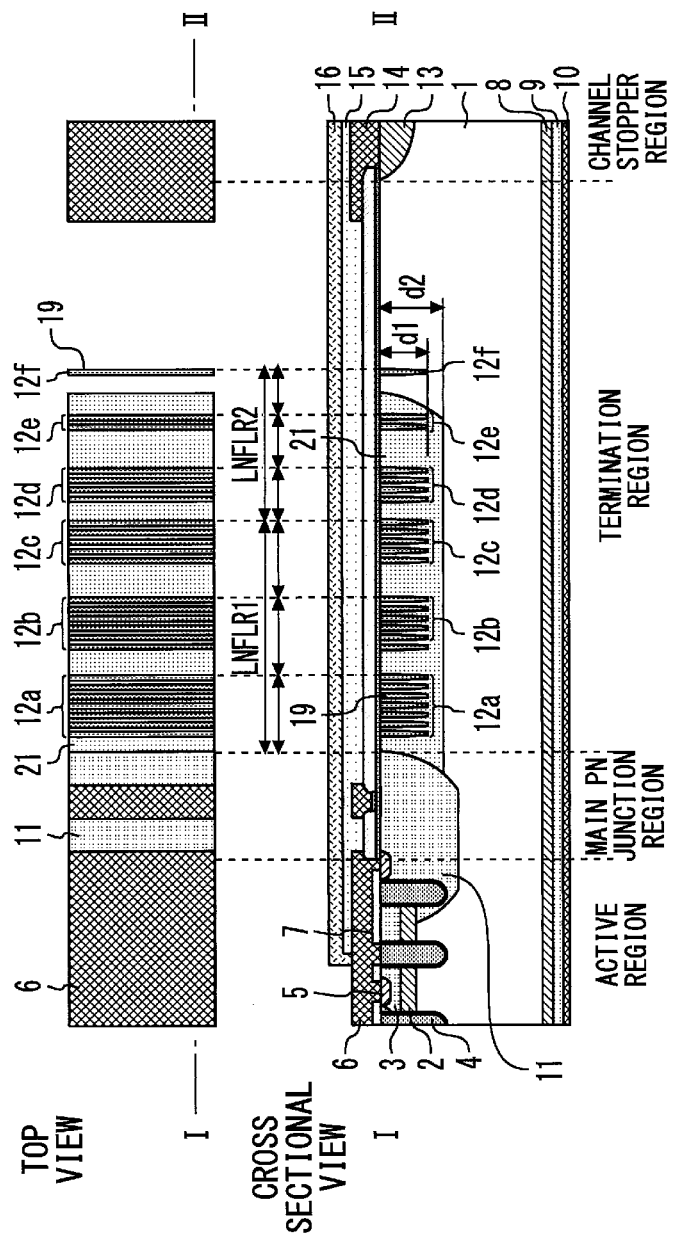
FIG. 31 shows a top view and a cross-sectional view of a semiconductor device according to Embodiment 11 of the present invention.

FIG. 31 shows a top view and a cross-sectional view of a semiconductor device according to Embodiment 11 of the present invention. The present embodiment is provided with features of both Embodiments 8 and 10 and can obtain effects of both embodiments.

Embodiment 12

Figure 32:
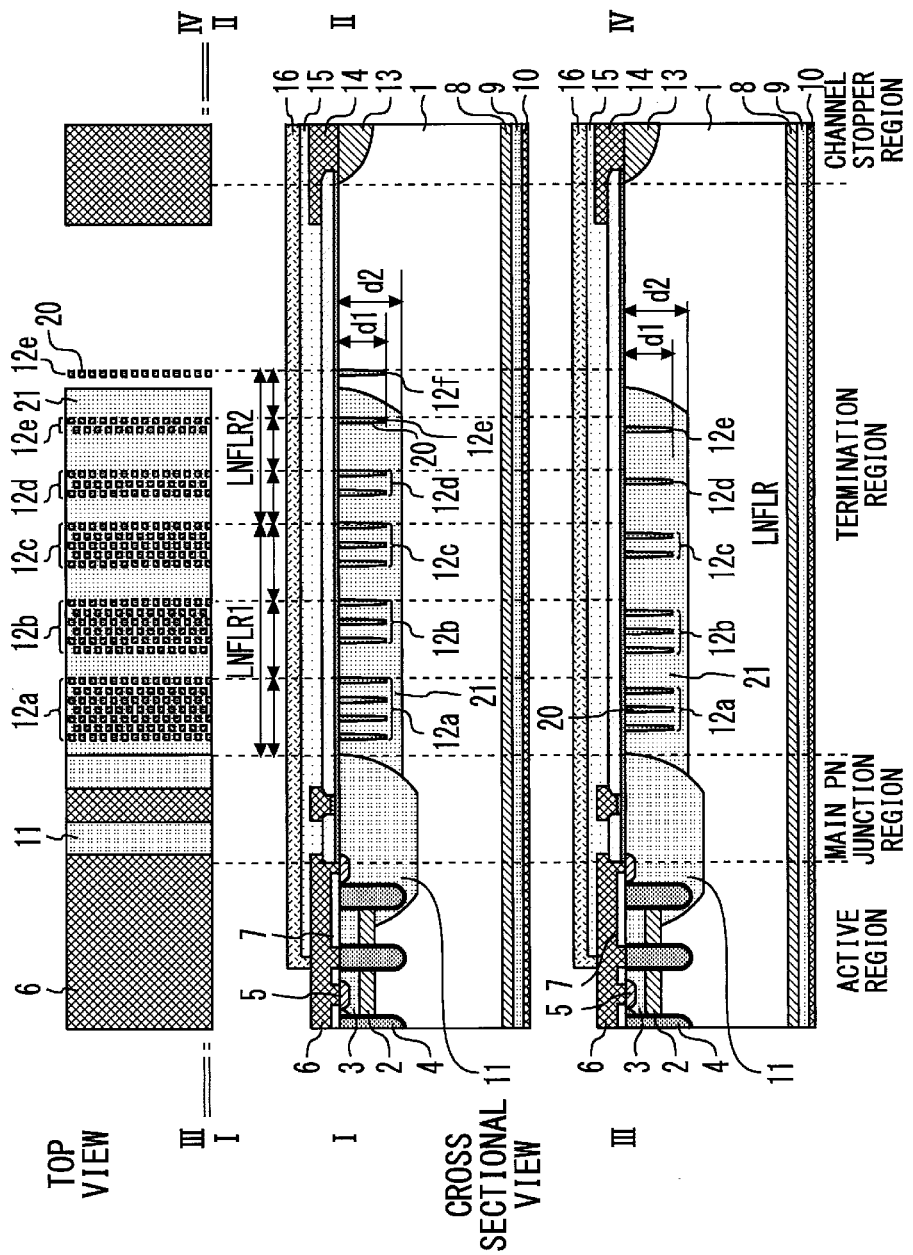
FIG. 32 shows a top view and a cross-sectional view of a semiconductor device according to Embodiment 12 of the present invention.

FIG. 32 shows a top view and a cross-sectional view of a semiconductor device according to Embodiment 12 of the present invention. The present embodiment is provided with features of both Embodiments 9 and 10 and can obtain effects of both embodiments.

Embodiments 1 to 12 above have described the high withstand voltage class semiconductor device of 4500 V, but the present invention is applicable irrespective of the withstand voltage class. A case has been described in the above embodiments where the transistor in the active region is an IGBT having a trench gate structure, but the present invention is also applicable to an IGBT or diode having a planar gate structure.

DESCRIPTION OF SYMBOLS

12a~12f P-type ring layer, 19 striped structure, 20 dotted structure, 21 P-type layer

The invention claimed is:
1. A semiconductor device maintaining a withstand voltage which is equal to or higher than a target withstand voltage, wherein a silicon substrate is provided with an active region in which a transistor is formed and a termination region located around the active region,
the termination region includes a ring region,
a plurality of ring-shaped P-type ring layers are regularly arranged in the ring region, the ring region is divided into a plurality of units which include the plurality of ring-shaped P-type ring layers respectively, a width of each unit is constant, a total number of P-type impurities in the ring region is N, the target withstand voltage is BV [V], a width of each unit is SandL [μm], and the number of the plurality of units is num, following relationships are satisfied, $$N \geq (M \times BV)^\gamma, M=10^4 \text{ to } 10^5, \gamma=0.55 \text{ to } 1.95,$$

$$SandL \times num \times Ecri \geq 2 \times \alpha \times BV,$$

$$Ecri=2.0 \text{ to } 3.0 \times 10^5 \text{ [V/cm]}, \alpha=10^0 \text{ to } 10^1, \text{and}$$

widths of the plurality of ring-shaped P-type ring layers of the plurality of units linearly decrease toward an outside of the termination region.

2. The semiconductor device according to claim 1, wherein the plurality of ring-shaped P-type ring layers include a plurality of striped structures regularly arranged in a plan view.

3. The semiconductor device according to claim 1, wherein the plurality of ring-shaped P-type ring layers include a plurality of dotted structures regularly arranged in a plan view.

4. The semiconductor device according to claim 1, wherein the termination region further includes a P-type layer that overlaps with at least part of the ring region, a surface concentration of the P-type layer is smaller than a surface concentration of the plurality of ring-shaped P-type ring layers, and a depth of the P-type layer is greater than a depth of the plurality of ring-shaped P-type ring layers.

5. A semiconductor device maintaining a withstand voltage which is equal to or higher than a target withstand voltage, wherein a silicon substrate is provided with an active region in which a transistor is formed and a termination region located around the active region, the termination region includes a plurality of ring regions, a plurality of ring-shaped P-type ring layers are regularly arranged in each ring region, each ring region is divided into a plurality of units which include the plurality of ring-shaped P-type ring layers respectively, a width of each unit is constant within the same ring region, a total number of P-type impurities in an i-th ring region among the plurality of ring regions is N(i), the target withstand voltage is BV [V], a withstand voltage supported by the i-th ring region is BV(i) [V], width of each unit of the i-th ring region is SandL(i) [μm], and the number of the plurality of units in the i-th ring region is num(i), following relationships are satisfied, $$N(i) \geq (M \times BV(i))^\gamma, M=10^4 \text{ to } 10^5, \gamma=0.55 \text{ to } 1.95,$$

$$\Sigma[SandL(i) \times num(i) \times Emax(i)] \geq 2 \times \alpha \times BV,$$

$$BV=\Sigma BV(i), Emax(i) \leq Ecri, Ecri=2.0 \text{ to } 3.0 \times 10^5 \text{ [V/cm]}, \alpha=10^0 \text{ to } 10^1, \text{and}$$

widths of the plurality of ring-shaped P-type ring layers of the plurality of units linearly decrease toward an outside of the termination region.

6. The semiconductor device according to claim 5, wherein the plurality of ring-shaped P-type ring layers include a plurality of striped structures regularly arranged in a plan view.

7. The semiconductor device according to claim 5, wherein the plurality of ring-shaped P-type ring layers include a plurality of dotted structures regularly arranged in a plan view.

8. The semiconductor device according to claim 5, wherein the termination region further includes a P-type layer that overlaps with at least part of the ring region, a surface concentration of the P-type layer is smaller than a surface concentration of the plurality of ring-shaped P-type ring layers, and a depth of the P-type layer is greater than a depth of the plurality of ring-shaped P-type ring layers.

* * * * *